United States Patent
Okuda et al.

(10) Patent No.: US 7,420,167 B2
(45) Date of Patent: Sep. 2, 2008

(54) APPARATUS AND METHOD FOR ELECTRON BEAM INSPECTION WITH PROJECTION ELECTRON MICROSCOPY

(75) Inventors: Hirohito Okuda, Yokohama (JP); Takashi Hiroi, Yokohama (JP); Hiroshi Makino, Kokubunji (JP)

(73) Assignee: Hitachi High-Technologies Corporation, Tokyo (JP)

(*) Notice: Subject to any disclaimer, the term of this patent is extended or adjusted under 35 U.S.C. 154(b) by 211 days.

(21) Appl. No.: 11/478,615

(22) Filed: Jul. 3, 2006

(65) Prior Publication Data

US 2007/0069127 A1    Mar. 29, 2007

(30) Foreign Application Priority Data

Aug. 17, 2005    (JP)   ............................. 2005-236305

(51) Int. Cl.
     *G21K 7/00*    (2006.01)
     *G01N 23/00*    (2006.01)
     *H01J 3/14*    (2006.01)

(52) U.S. Cl. .................. 250/310; 250/306; 250/307; 250/396 R; 250/397

(58) Field of Classification Search ................ 250/310, 250/306, 307, 396 R, 397
See application file for complete search history.

(56) References Cited

U.S. PATENT DOCUMENTS

2007/0194229 A1*   8/2007   Okuda et al. ................ 250/310
2007/0272857 A1*   11/2007   Hasegawa et al. ........... 250/307

FOREIGN PATENT DOCUMENTS

JP    2003-202217    7/2003
JP    2004-363085    12/2004

OTHER PUBLICATIONS

Hasegawa et al., Development of EB wafer Inspection Technique by Using Mirror Electron Projection, LSI Testing Symposium, pp. 89-93, 2004.
Murakami et al., Development of an Electron Beam Inspection System Based on Projection Imaging Microscopy, LSI Testing Symposium, pp. 85-87, 2004.
Nagahama et al., Inspection performance of the electron beam inspection system based on projection electron microscopy, pp. 921-928, SPIE vol. 5375, 2004.
Satake et al., Electron beam inspection system for semiconductor wafer, based on projection electron microscopy, pp. 1125-1134, SPIE vol. 5375, 2004.

* cited by examiner

*Primary Examiner*—Nikita Wells
(74) *Attorney, Agent, or Firm*—Antonelli, Terry, Stout & Kraus, LLP.

(57) ABSTRACT

An apparatus and method for electron beam inspection with projection electron microscopy, is constructed so as to allow correction of changes in focus offsets due to changes in the electrically charged state particularly during inspection. The apparatus includes: a focus measure sensor unit; a focus measure calculation unit which calculates focus measure from the multiple image signals converted by the focus measure sensor unit; a focus position calculation unit which calculates the height of a confocal plane conjugate to the plane of convergence of a planar electron beam by an objective lens, on the basis of the calculated focus measure, and then calculates the focus position of the objective lens on the basis of the calculated height of the confocal plane; and a focus position correction unit which corrects the focus position of the objective lens according to the calculated focus position of the objective lens.

18 Claims, 19 Drawing Sheets

MOVING DIRECTION OF BEAM IRRADIATION REGION

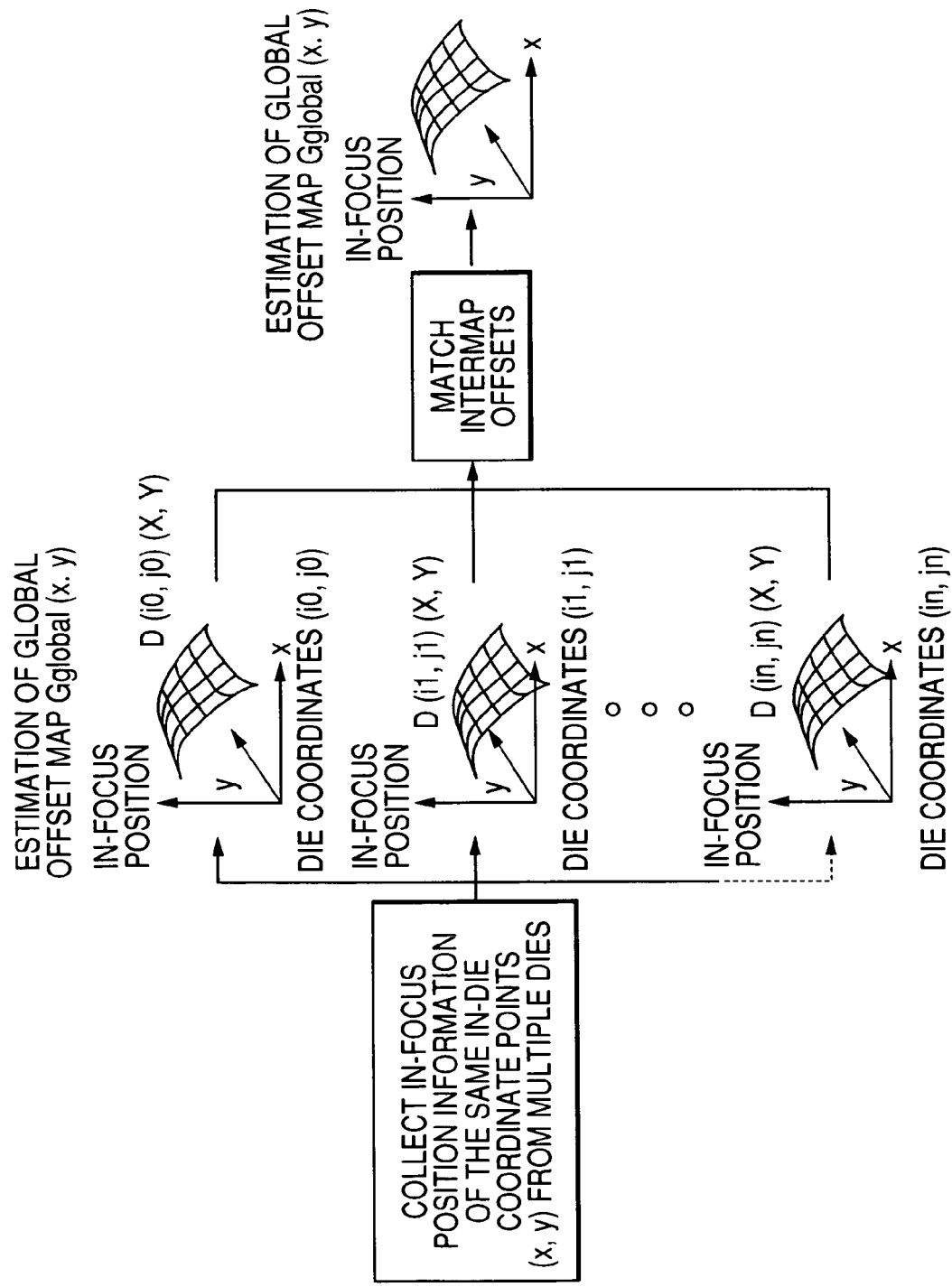

SCANNING DIRECTION

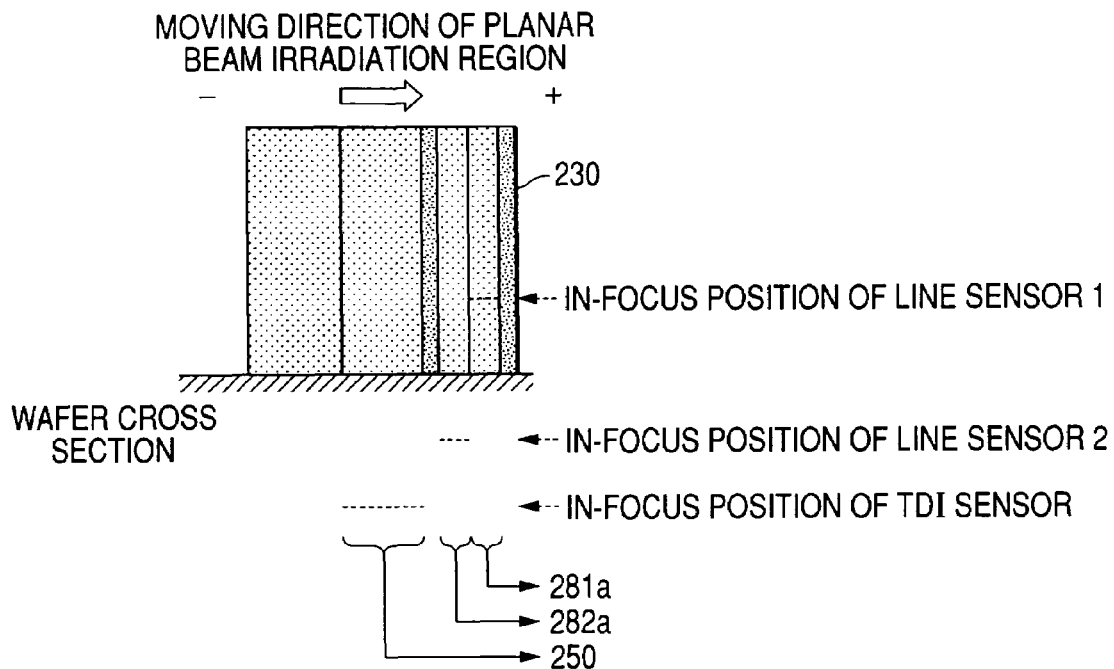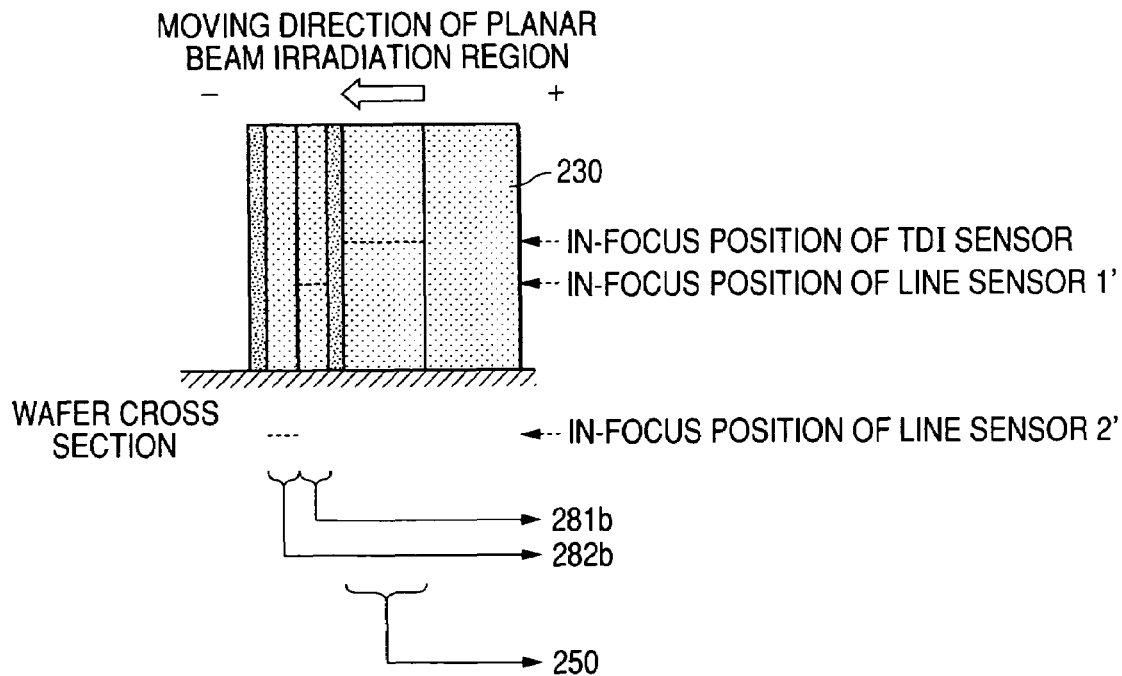

SCANNING DIRECTION

APPARATUS AND METHOD FOR ELECTRON BEAM INSPECTION WITH PROJECTION ELECTRON MICROSCOPY

BACKGROUND OF THE INVENTION

The present invention relates to an apparatus and method for electron beam inspection with projection electron microscopy, the apparatus and method being intended to irradiate with a planar electron beam an object to be inspected (hereinafter, this object may be referred to as the object), and inspect defects or defect candidates present on the object.

During electron beam inspection of semiconductor wafers, electron beam inspection apparatuses of the projection electron microscopic type using a planar electron beam to irradiate an object to be inspected are used as powerful tools to improve throughput, instead of the scanning type that uses spot-shaped electron beam irradiation. These electron beam inspection apparatuses are known in Japanese Patent Laid-open Nos. 2003-202217 and 2004-363085, and in Japanese academic journal papers "Hasegawa et al.: Development of EB wafer Inspection Technique by Using Mirror Electron Projection, LSI Testing Symposium, pp. 89-93, 2004", "Murakami et al.: Development of an Electron Beam Inspection System Based on Projection Imaging microscopy, LSI Testing Symposium, pp. 85-87, 2004", "Nagahama et al.: Inspection performance of the electron beam inspection system based on projection electron microscopy, pp. 921-928, SPIE Vol. 5375, 2004", and "Satake et al.: Electron beam inspection system for semiconductor wafer, based on projection electron microscopy, pp. 1125-1134, SPIE Vol. 5375, 2004".

Japanese Patent Laid-open No. 2003-202217 describes a defect inspection apparatus that detects the existence and positions of defects in a plurality of regions on the surface of an object to be inspected (hereinafter, this object is referred to as the object). Defect detection by this apparatus includes: forming an electric field that decelerates an electron beam, on the surface of the object; reflecting, in the immediate vicinity of the surface of the object, a planar electron beam that includes energy components unable to reach the surface of the object because of the presence of the deceleration electric field and has a certain area, and forming images of the plural regions of the surface of the object by use of an image-forming lens; acquiring the images; storing the acquired images into an image storage section; and detecting the existence and positions of defects in the plural regions by comparing the stored images.

Also, Japanese Patent Laid-open No. 2004-363085 describes an inspection apparatus including: electron irradiating means that creates a crossover by generating an electron and forming images at a desired magnification, and irradiates a substrate with the electron so as to form a desired sectional shape; means that moves at least either one of the electron with which the substrate is to be irradiated, and a stage to hold the substrate, and moves, in a relative fashion with respect to the electron or the stage, the regions on the substrate that are to be irradiated with charged particles; a detector that detects the electron which has been used to obtain information on the surface of the substrate; means that acquires a detection image of a die to be inspected, by using the information of the substrate surface which has been detected by the detector; means that acquires an image of a reference die which is used as the basis for comparison with the detection image of the die to be inspected; and means that compares the image of the reference die and the image of the die to be inspected.

However, neither of the above six publications has given any consideration to an automatic focusing technique for conducting real-time corrections for changes in focus offsets due to time-varying changes in the electrically charged state of the surface of the object, in the respective electron beam inspection techniques based on projection electron (or imaging) microscopy. That is, no such consideration has been given in Japanese Patent Laid-open Nos. 2003-202217 and 2004-363085 or in Japanese academic journal papers "Hasegawa et al.: Development of the wafer electron beam inspection technology based on mirror electron projection, LSI Testing Symposium, 2004", "Murakami et al.: Development of an electron beam defect inspection system based on projection imaging microscopy, LSI Testing Symposium, pp. 85-87, 2004", "Nagahama et al.: Inspection performance of the electron beam inspection system based on projection electron microscopy, pp. 921-928, SPIE Vol. 5375, 2004", and "Satake et al.: Electron beam inspection system for semiconductor wafer, based on projection electron microscopy, pp. 1125-1134, SPIE Vol. 5375, 2004".

SUMMARY OF THE INVENTION

The present invention provides an apparatus and method for electron beam inspection based on projection electron microscopy. That is to say, the electron beam inspection apparatus and method of the present invention are adapted to allow correction of changes in focus offsets due to changes in an electrically charged surface state of an object during a time from calibration measurement and thereafter, particularly during inspection.

More specifically, an aspect of the present invention is an apparatus and method for electron beam inspection with projection electron microscopy, including: an electron irradiation optics which shapes (formes) an electron beam emitted from an electron source to a planar electron beam, then after deflecting the electron beam as the planar electron beam via a beam separator, converges and irradiates the planar electron beam via an objective lens to the surface of an object to be inspected; an electric-field generating unit which generates such an electric field that causes the planar electron beam irradiated from the electron irradiation optics to be drawn backward from neighborhood of the surface of the object; an electron-imaging optics which deflects through the beam separator the electron beam which has been drawn backward from the neighborhood of the surface of the object by the electric field generated by the electric-field generating unit, and images an electron beam image of the electron beam; an image detection unit which detects an inspection image signal by converting a focusing inspection image imaged by the electron-imaging optics into the inspection image signal; and a defect judgment unit which detects a defect formed on the object, by judgment processing the inspection image signal detected by the image detection unit.

In the above electron beam inspection apparatus and method of the present invention, a focus position controller which controls a focus position of the objective lens so that the focusing inspection image of the object can be detected by the image detection unit to detect is adapted to include: a focus measure calculation unit which calculates focus measure from a plurality of image signals into which electron beam images imaged by the electron-imaging optics, at a plurality of focus positions different from one another in focus offsets, are converted by the image detection unit; a focus position calculation unit which calculates height of a confocal plane conjugate to a plane of convergence of the planar electron beam by the objective lens in relation to the electron-imaging optics, on the basis of the focus measure calculated by the focus measure calculation unit, and then calculates the focus position of the objective lens to detect the focusing inspection image of the object in the image detection unit, on the basis of the calculated height of the confocal plane; and focus position correction unit which corrects the focus position of the objective lens according to the focus position thereof calculated by the focus position calculation unit.

Another aspect of the present invention is an apparatus and method for electron beam inspection with projection electron microscopy, including: an electron irradiation optics which shapes (forms) an electron beam emitted from an electron source to a planar electron beam, then after deflecting the electron beam as the planar electron beam via a beam separator, converges and irradiates the planar electron beam via an objective lens to the surface of an object to be inspected; an electric-field generating unit which generates such an electric field that causes the planar electron beam irradiated from the electron irradiation optics to be drawn backward from neighborhood of the surface of the object; an electron-imaging optics which deflects through the beam separator the electron beam which has been drawn backward from the neighborhood of the surface of the object by the electric field generated by the electric-field generating unit, and forms an electron beam image of the electron beam; an inspection image detection sensor unit which detects an inspection image signal by converting a focusing inspection image of an inspection region of the object imaged by the electron-imaging optics, into the inspection image signal; and an image processing unit which conducts image processing of the inspection image signal which has been detected by the inspection image detection sensor unit, and detects a defect formed on the object.

In the above electron beam inspection apparatus and method of the present invention, a focus position controller which controls a focus position of the objective lens so that the focusing inspection image of the inspection region can be detected by the inspection image detection sensor unit is adapted to include: a focus measure calculation unit with a focus measure sensor section by which electron beam images imaged by the electron-imaging optics, at a plurality of focus positions different from one another in focus offsets, are converted into image signals, wherein the focus measure calculation unit then calculates focus measure from the plurality of image signals converted by the focus measure sensor section; a focus position calculation unit which calculates height of a confocal plane conjugate to a plane of convergence of the planar electron beam by the objective lens in relation to the electron-imaging optics, on the basis of the focus measure calculated by the focus measure calculation unit, and then calculates the focus position of the objective lens to detect the focusing image detection sensor section, on the basis of the calculated height of the confocal plane; and a focus position correction unit which corrects the focus position of the objective lens according to the focus position thereof calculated by the focus position calculation unit.

According to the present invention, conducting real-time corrections for focus offsets generated by electrical charge occurring during executing the inspection in the apparatus and method for electron beam inspection with projection electron microscopy provides the following advantageous effects:

(1) Samples that easily become electrically charged can be inspected.
(2) Inspection time is not increased by refocusing during executing the inspection.
(3) Inspection conditions can be easily set up for the samples that easily become electrically charged.

These and other objects, features, and advantages of the invention will be apparent from the following, further detailed description of preferred embodiments of the invention, as illustrated in the accompanying drawings.

BRIEF DESCRIPTION OF THE DRAWINGS

FIG. 7 is an explanatory diagram on estimation of off-line global focus offsets with respect to various samples (wafers) in the present invention;

FIG. 14A is a sectional view of a sample, illustrating a focusing operation in which a planar electron beam moves in a plus (+) direction in the fourth embodiment of the present invention;

FIG. 14B is a sectional view of the sample, illustrating a focusing operation in which the planar electron beam moves in a minus (−) direction;

DESCRIPTION OF THE PREFERRED EMBODIMENTS

Preferred embodiments of a projection electron microscopy-based electron beam inspection apparatus and method according to the present invention will be described hereunder using the accompanying drawings.

First Embodiment

Figure 1:
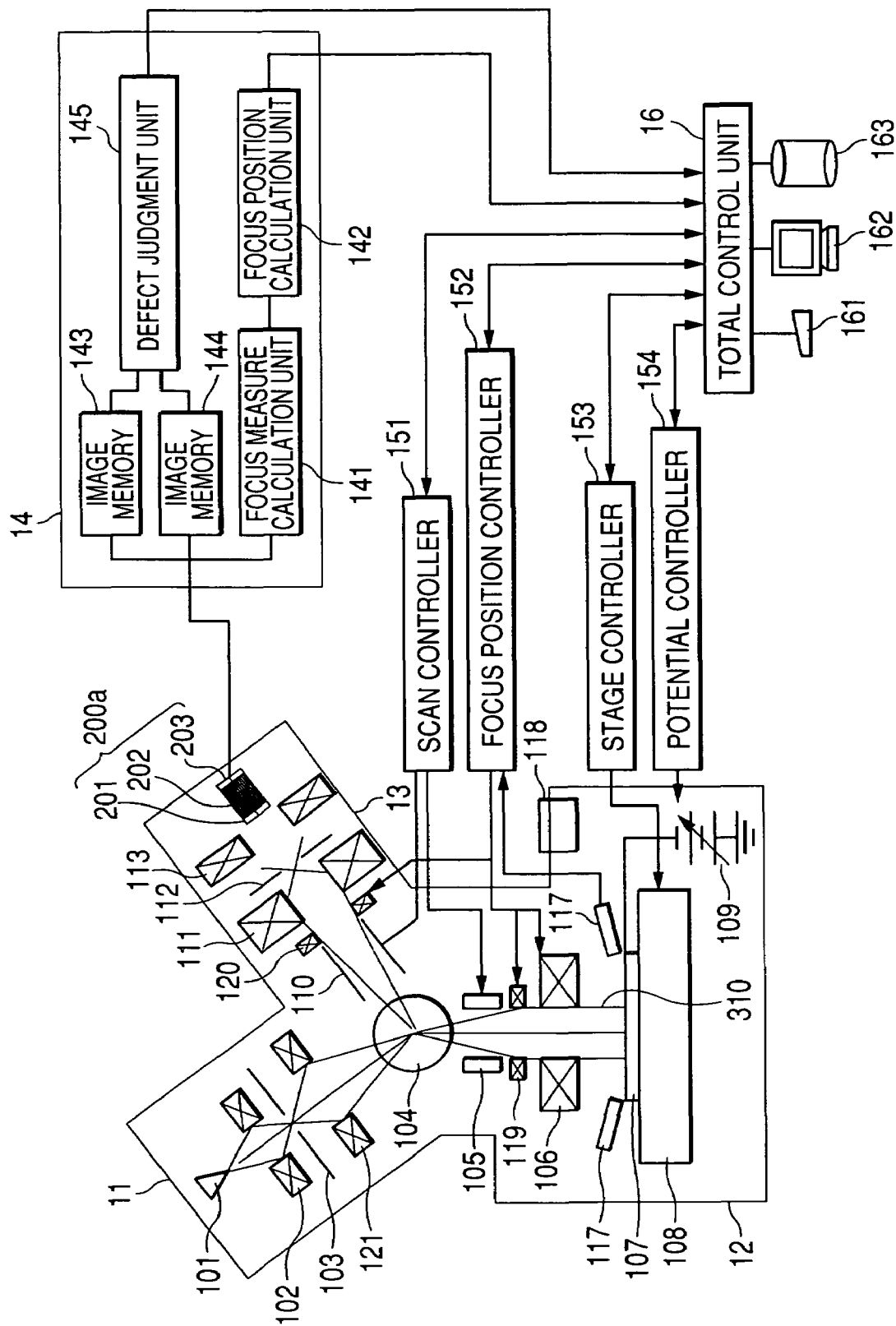
FIG. 1 is a total configuration diagram showing a first embodiment of a projection electron microscopy-based electron beam inspection apparatus according to the present invention.

A first embodiment of a projection electron microscopy-based electron beam inspection apparatus and method according to the present invention is described below using FIG. 1. FIG. 1 shows a configuration of the first embodiment of the present invention. This apparatus of the first embodiment mainly includes electron irradiation optics 11, a sample-wafer chamber 12, electron-imaging optics 13, an image processing unit 14, various controllers 15, and a total control unit 16. More specifically, the controllers 15 refer to: a scan controller 151 that controls an irradiating deflector 105 and an imaging deflector 110; a focus position controller 152 that controls an objective lens 106, a focus correction coil 1 (119), and a focus correction coil 2 (120); a stage controller 153 that controls a stage 108; and a potential controller 154 that controls a power supply (an electric field generator) 109. The total control unit 16 controls the entire apparatus, inclusive of, for example, the controllers 15 and the image processing unit 14.

The electron irradiation optics 11 includes an electron source 101, condenser lenses 102 and 121, a diaphragm 103, a beam separator 104, the irradiating deflector 105, the focus correction coil 1 (119), and the objective lens 106.

The electron-imaging optics 13 includes the imaging deflector 110, the focus correction coil 2 (120), an imaging lens 111, a contrast aperture 112, a magnifying lens 113, and a sensor unit 200a that detects electron beam images. The sensor unit 200a is constructed essentially of a photoluminescent plate 201, an optical-fiber bundle 202, and a line sensor section 203 that includes detection elements such as TDI sensors and one-dimensional or two-dimensional charge-coupled devices (CCDs).

The sample-wafer chamber 12 includes a sample-moving stage 108 having a sample 107 rested thereon, the stage 108 being controlled by the stage controller 153. The sample wafer chamber 12 also includes the power supply 109 that is an electric field generator for generating such an electric field that draws an electron beam backward from neighborhood of the surface of the sample 107 (an object to be inspected), the power supply 109 having its negative potential controlled by the potential controller 154. In addition, the sample wafer chamber 12 includes an optical height detection sensor 117 that optically detects surface height of the sample 107.

The image processing unit 14 includes: a focus measure calculation unit (focus measure measuring section) 141, a focus position calculation unit 142, an image memory 143, an image memory 144, and a defect judgment unit 145. The focus measure calculation unit 141, in a focus map creation and in an inspection implementation, measures focus measure in accordance with electron beam signals detected at multiple focus offset positions by the sensor unit 200a, based on the surface height of the sample that has been detected by the optical height detection sensor 117. The focus position calculation unit 142 calculates height of a confocal plane (focusing plane) conjugate to a plane of convergence of an emitted planar electron beam by the objective lens etc. in relation to the electron-imaging optics 13 on the basis of the focus measure measured by the focus measure calculation unit 141 and calculates a focus position of the objective lens so that the sensor unit 200a detects a focusing inspection image of an inspection region of the object under inspection on the basis of the calculated height of the confocal plane. The image memory 143 stores an inspection image signal the sensor unit 200a detects. The image memory 144 stores a reference image signal. The defect judgment unit 145 compares the inspection image signal with the reference image signal which does not contain wafer defects (this reference image signal can be a threshold image signal), and detects defects or defect candidates.

Additionally, an input device 161 such as a keyboard or mouse, a display device 162 for displaying data such as GUI data, and a storage device 163 for storage of data such as focus maps and inspection object layout data, are connected to the total control unit 16.

First, the electron irradiation optics 11 is described in detail first. An accelerated electron beam that has been emitted from the electron source 101 previously impressed with a negative high potential from an accelerating power supply (not shown) is converged by the condenser lenses 102, 121 and diaphragmed (shaped) by the diaphragm 103 having a rectangular aperture. The electron source 101 is a Zr/O/W type of Schottky electron source. This electron source can provide stably a planar electron beam having a large current beam of 1.5 μA, for example, and a uniform energy width of 1.5 eV. The beam separator 104 separates two optical paths. One is an optical path of an incident electron beam from the electron source 101, and the other is an optical path of a mirror electron beam from the sample 107 (the object to be inspected). The condenser lenses 102, 121 form a crossover on an anterior focal plane of the objective lens 106. Also, the diaphragm 103 and the objective lens 106 have their arrangement optimized so that the lens 106 forms an image of the diaphragm 103 on the surface of the sample 107.

A planar electron beam formed (shaped) into the shape of the aperture of the diaphragm 103 and having all electrons' orbits aligned essentially in parallel with respect to one another is thus formed vertically towards the surface of the sample 107. The rectangular diaphragming aperture of the diaphragm 103 is, for example, 100 μm square in size, and the beam, after being passed through this aperture, is narrowed down to, for example, about ½ of the aperture size when the beam moves past the objective lens 106. This forms a planar electron beam with a size of, for example, 50 μm square on the surface of the sample 107. This planar electron beam can be moved to (or scanned at) any position on the surface of the sample 107 by the irradiating deflector 105 controlled by the scan controller 151.

Even if the anterior focal plane and crossover position of the objective lens 106 cannot be completely matched, there is no problem if the mismatch lies within a certain permissible range. In addition, the crossover, although ideally zero in size, actually has a finite size since the electron source 101, such as an electron gun, and the condenser lenses each have specific aberration. There is no problem if the finite size lies within a certain permissible range. In the electron irradiation optics 11 where the position of the crossover is accurately controlled and the aberration of the electron gun 101 and that of the condenser lenses 102, 121 are sufficiently reduced, a spread of an incident beam angle with respect to the sample is one of factors which determine resolution of an enlarged image of the sample surface formed by mirror electrons. The above spread of the incident beam angle is represented by the following expression (1):

$$r0 = \beta^2 \cdot Zm \quad (1)$$

where "r0" denotes the resolution determined by the spread of the incident beam angle, "β" a maximum half angle of incidence, and "Zm" a distance at which an electric field is occurring that draws electrons backward.

In the present embodiment, "β" is 0.25 mrad and "Zm" is 5 mm. Assigning these values to expression (1) makes "r0" equal to 0.3 nm, which indicates that the above resolution is not affected in the present embodiment. Beam current can therefore be increased according to particular requirements. Since even a resolution as low as about 30 nm is considered to suffice for defect detection of semiconductor wafers, if "Zm" is 5 mm, "β" up to 2.4 mrad is permissible. In this case, therefore, great margins occur not only for permissible shifts in position with respect to the anterior focal plane crossover of the objective lens 106, but also for the size of the crossover.

The following expressions (2) and (3) hold if a beam spread half angle on the anterior focal plane is taken as "α", a focal length of the objective lens 106 as "f", a shift in position of the crossover as "Δf", and a radius of the planar electron beam as X:

$$\Delta f = f \beta / \alpha \quad (2)$$

$$\alpha = X/(2f) \quad (3)$$

Expressions (2) and (3) indicate that, for example, if the radius X of the planar electron beam is defined as 40 μm for a focal length "f" of 10 mm of the objective lens 106, there is no problem, even when the positional shift "Δf" of the crossover is about 10 mm. This value is equivalent to a beam diameter of about 40 μm on the anterior focal plane. In any case, it can be seen that sufficient resolution can be obtained by bringing the crossover of the electron beam into close proximity to the anterior focal plane of the objective lens 106.

The beam separator 104 is described next. The beam separator 104 causes the emitted electron beam from the electron source 101 to be deflected in a direction of the sample 107. Secondary or mirror electrons that have been drawn backward from the sample 107 are deflected in a direction of the imaging lens 111, not in the direction of the electron source 101 by the beam separator 104. An optimal deflector that performs such an action is a magnetic deflector since deflection action by a magnetic field differs a direction of the deflection action depending on an incident direction of electrons. Optics in which an optical axis of an imaging lens 111 and an optical axis of an objective lens 106 are arranged on a straight line uses an ExB deflector for rendering an electric field and a magnetic field orthogonal to each other and causing secondary or mirror electrons from below to advance directly and only a primary electron beam from above to deflect.

The sample 107 and the sample-moving stage 108 are impressed with a negative potential slightly larger in absolute value than that of the electron source 101 by the power supply 109 which is the electric field generator that generates such an electric field as to draw an electron beam backward from neighborhood of the surface of the sample 107 (the object under inspection). The power supply 109 is constructed so that the negative potential is controlled by the potential controller 154. More specifically, the power supply 109 is preferably constructed so that the negative potential applied to the sample 107 is only 0.5 to 5.0 V. Too high a negative potential deteriorates the resolution of the image. Conversely, too low a negative potential results in surface roughness and/or slight changes in potential being detected as images extremely strong in contrast, and thus makes it difficult to detect truly necessary defects only. In short, when the electron-imaging optics 13 detects secondary electrons from the surface of the sample, the power supply 109 that applies the negative potential to the sample 107 and the sample-moving stage 108 pulls the secondary electrons upward by applying an electric field so as to enable efficient collection of the secondary electrons that have been driven away from the surface of the sample. When the electron-imaging optics 13 detects the mirror electrons reflecting from the surface of the sample, the power supply 109 applies an electric field of such a level as to make the electrons of the emitted beam return on the verge of the sample surface.

As described above, the electron beam that has been deflected by the beam separator 104 is formed via the objective lens 106 as a planar electron beam aligned in the vertical direction with respect to the surface of the sample (inspection object) 107. Also, a negative potential almost equal to or slightly higher than an accelerating voltage of the electron beam is applied to the sample 107 by the power supply (electric field generator) 109. Consequently, an electric field is formed that incorporates shapes of circuit patterns formed on the surface of the sample 107, and/or an electrically charged condition of the sample surface.

A large portion of the planar electron beam 310 directed vertically to the surface of the sample (inspection object) 107, therefore, is decelerated in front of the sample 107 by the above negative potential, then pulled back in an upward direction by the electric field on the surface of the sample 107, and drawn upward with the directivity and intensity that incorporate circuit pattern information of the sample 107. The secondary electrons or mirror electrons that have thus been drawn backward are focused via the objective lens 106 and then deflected towards the imaging deflector 110 and the imaging lens 111 by the beam separator 104. After this, a surface state of the sample 107 is imaged by the imaging lens 111, whereby a secondary electron beam image or a mirror electron beam image is formed on an imaging surface 112.

Projecting the thus-formed electron beam image in a larger scale on the photoluminescent plate 201 via the magnifying lens 113 makes it possible to obtain a photoluminescent image (microscopic image) that incorporates the circuit patterns on the surface of the sample (inspection object) 107 and/or the electrically charged condition of the sample surface.

The contrast aperture 112 is constructed in an inserted condition at the crossover plane in order to improve the contrast and resolution of the above electron beam image. Since the contrast aperture 112 removes electrons not imaged when the electrons of the emitted beam are drawn backward by the electric field on the surface of the sample 107, a high-resolution high-contrast microscopic image of a defect can be obtained on the photoluminescent plate 201.

A need arises, with the progress of finer semiconductor structuring, for any differences of about 1 V in charge potential to be detected as defects on fine patterns. Accordingly, an electron beam energy width to be used in the present invention is desirably equal to 2.0 eV or less. As described above, when a Zr/O/W type of Schottky electron source is used as the electron source 101, there is no problem since this electron source has an energy width of 1.5 eV. If an electron source of a greater energy width is used, however, there is a need to provide an energy filter on an optical path of the electron beam emitted from the electron source, and control an energy width of electrons to 2.0 eV or less during a time from electron emission from the electron source to formation of a final image. While the energy filter is desirably provided between the electron source 101 and the sample 107, similar advantageous effects are also achievable by conducting energy filtering for the secondary electrons or mirror electrons drawn backward from the sample 107.

During detection of the mirror electrons, the electron beam does not impinge on the sample 107. In principle, therefore, even if a dielectric film is present on the surface of the sample 107, no electrical charge occurs on the surface. If the inspection is conducted in such a non-charged condition, detectable defects will be ones of a three-dimensional shape (i.e., defects whose shapes differ from those of nondefective sections). In addition, in order to elicit any short circuits or other electrical defects as mirror images, before an inspection image is detected, a charge controller 118 is activated to irradiate the inspection object with an electron beam shower and positively or negatively charge the electrically defective sections in a relative fashion with respect to normal sections. Thus, equipotential planes neighboring the electrically defective sections on the sample surface are caused to differ from normal sections in terms of shape. The electrically defective sections are consequently elicited in the mirror images.

Figure 2:
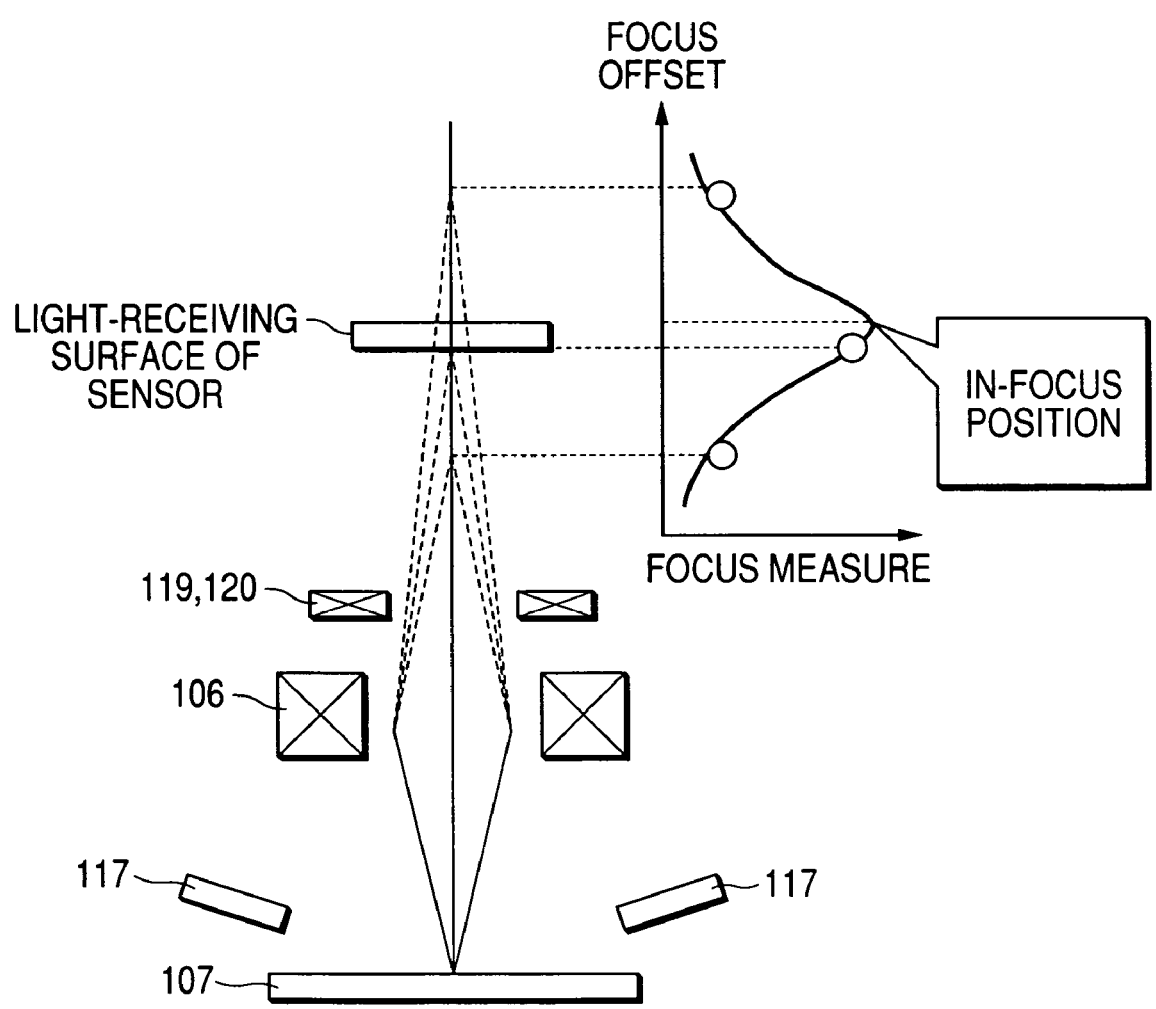
FIG. 2 is an explanatory diagram of calculation principles of an in-focus position according to the present invention.

Next, calculation principles of an in-focus position are described below using FIG. 2. When the sample (inspection object) 107 is irradiated with the planar electron beam 310, the secondary electron image or mirror electron beam image obtained from the sample 107 is received, as light, on a light-receiving surface of the sensor unit 200a by the imaging optics 111, 112, 113 via the objective lens 106 and focus correction coils 119 and 120 capable of focusing correction according to focus offsets. An electron beam image signal appropriate for focus measure is detected as a result. This state is shown in FIG. 2. As shown therein, reference height is measured and detected at a measuring point or in-focus position on the sample by the optical height detection sensor 117 first. After that, with the reference height as reference, the total control unit 16 sequentially sets in the focus position controller 152 a plurality of mutually different heights (focus offsets) for the focus position of the objective lens 106. If the sample-moving stage 108 has a Z-stage, the surface of the sample can also be adjusted to the above reference height. Next, the focus position controller 152 sequentially changes the focus position to the sequentially set plural heights mentioned above, the electron irradiation optics 11 irradiates the measuring point or in-focus position with the planar electron beam 310, and the sensor unit 200a detects the secondary electron beam image or mirror electron beam image resultingly obtained from the particular measuring point or in-focus position. The focus measure calculation unit (focus measure measuring section) 141 measures the focus measure in accordance with the detected electron beam image signal, and the focus position calculation unit 142 calculates height (in-focus position) of a confocal plane conjugate to the plane of convergence of the emitted planar electron beam in relation to the electron-imaging optics 13, indicated by a peak position on the basis of the measured focus measure. Thus, a focus position of the objective lens 106 inclusive of the focus correction coils 119 and 120 can be calculated so that the sensor unit 200a detects a focusing inspection image of an inspection region of the sample surface on the basis of the calculated height of the confocal plane.

Second Embodiment

Figure 3:
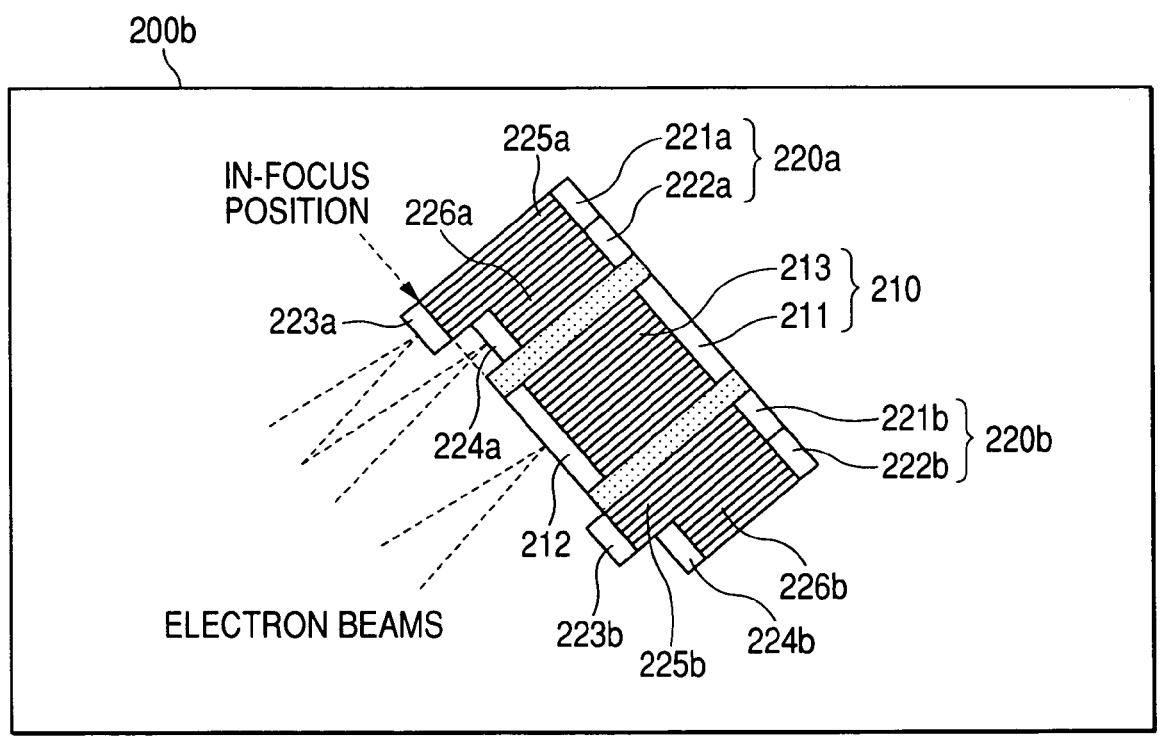
FIG. 3 is an enlarged diagram of a sensor unit in a second embodiment of a projection electron microscopy-based electron beam inspection apparatus according to the present invention.
Figure 4A:
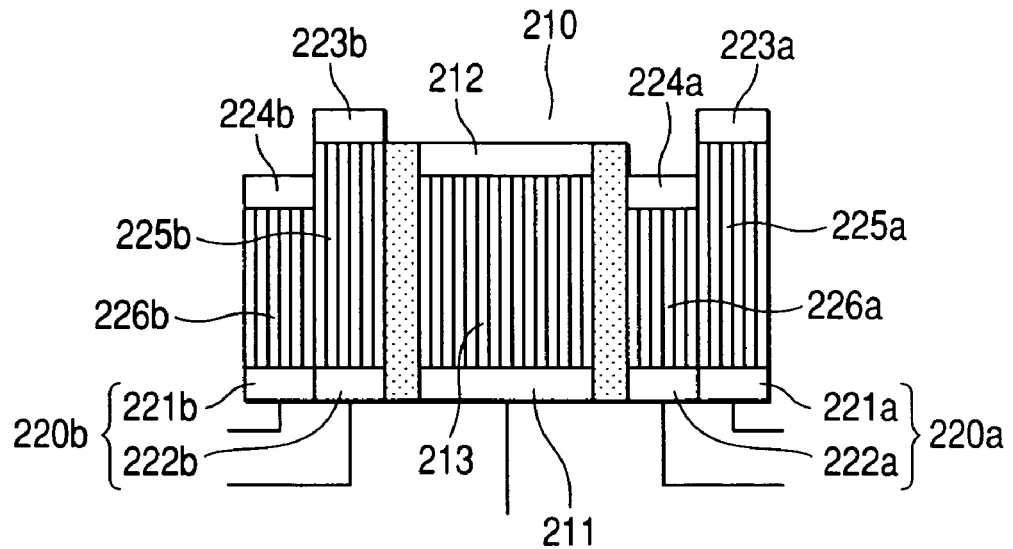
FIG. 4A is a front, sectional view of the sensor unit in the second embodiment of the present invention.
Figure 4B:
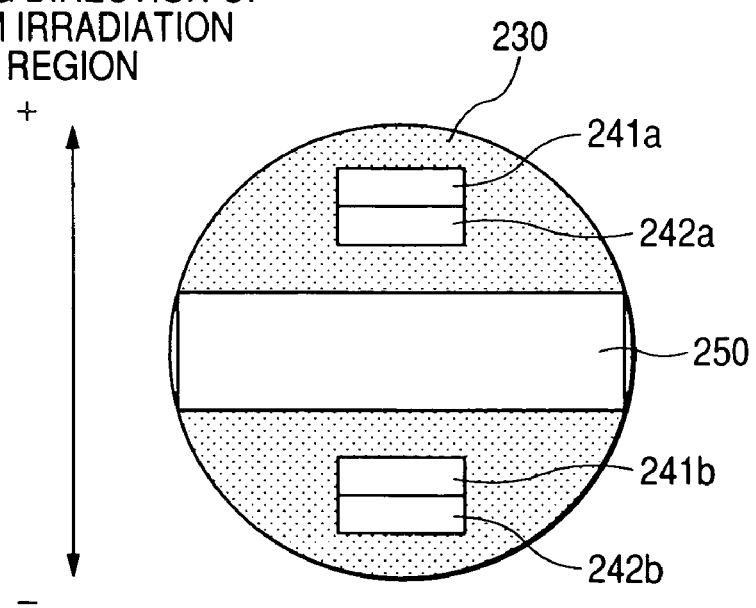
FIG. 4B is a diagram showing a positional relationship between a detection region of a TDI sensor and detection regions of line sensors in a planar electron beam irradiation region according to the second embodiment.
Figure 5A:
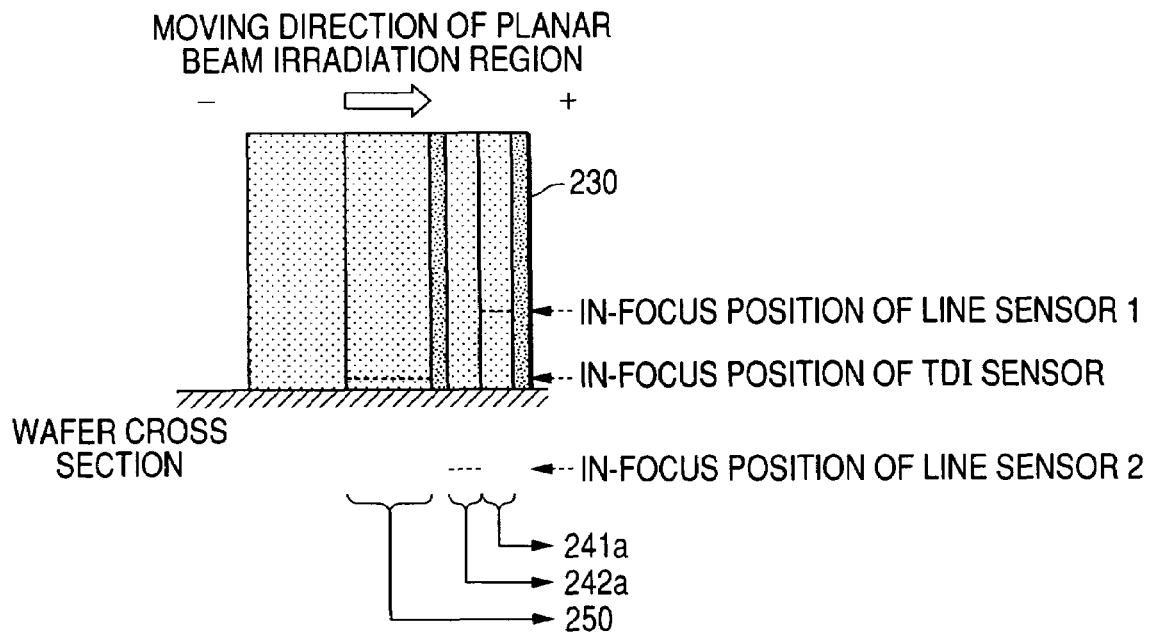
FIG. 5A is a sectional view of a sample, illustrating a focusing state in which a planar electron beam moves in a plus (+) direction in the second embodiment of the present invention.
Figure 5B:
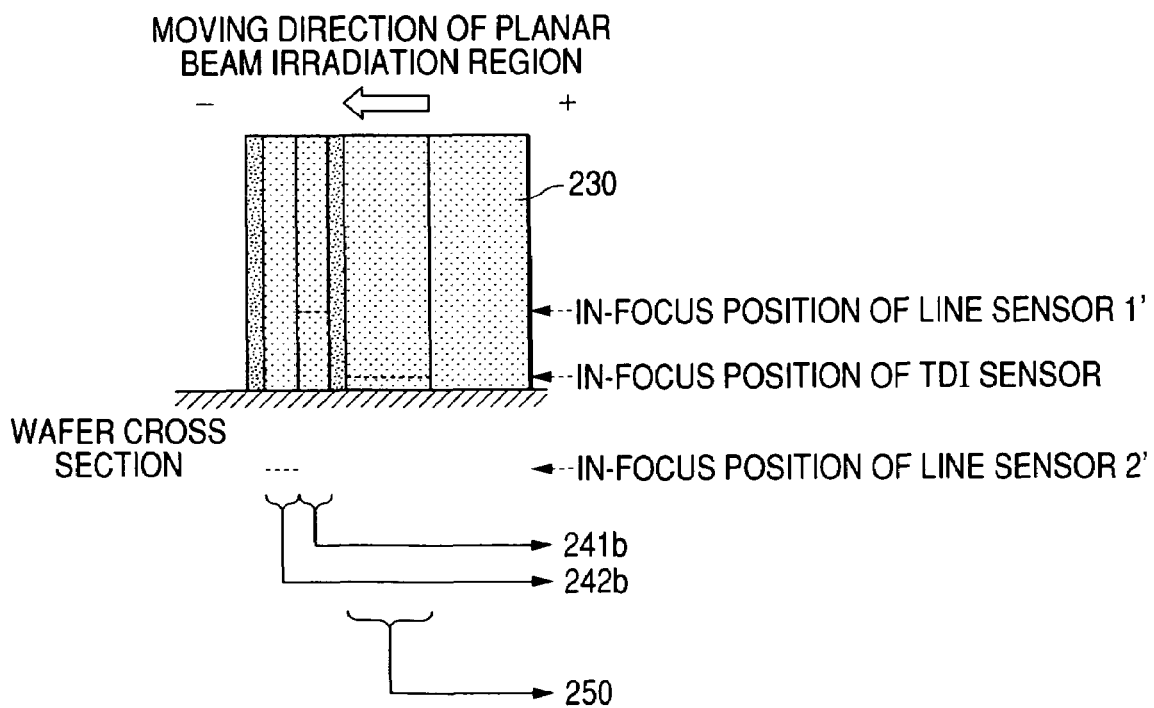
FIG. 5B is a sectional view of the sample, illustrating a focusing state in which the planar electron beam moves in a minus (−) direction.

Next, a second embodiment of a projection electron microscopy-based electron beam inspection apparatus according to the present invention is described below using FIGS. 3 to 6A and 6B. FIG. 3 is an enlarged view of a sensor unit 200b. FIGS. 4A and 4B are views that show relationships in position between various sensors and detection regions. FIGS. 5A and 5B are views that show differences in sensor operation according to a particular moving direction of a planar electron beam 310. FIG. 5A shows a focusing state in which an irradiation region 230 of the planar electron beam 310 is moved in a plus (+) direction, that is, in which a sample 107 is moved in a minus (−) direction. FIG. 5B shows a focusing state in which the irradiation region 230 of the planar electron beam 310 is moved in the minus (−) direction, that is, in which the sample 107 is moved in the plus (+) direction. The present second embodiment differs from the first embodiment in that as shown in FIGS. 3 and 4A, the sensor unit 200b is divided into a sensor section 210 for detecting inspection image signals, and focus measure detection sensor sections 220a and 220b arranged on both sides of the sensor section 210. The sensor section 210 is subdivided into a photoluminescent plate 212 for converting an electron beam image into photoluminescent light, an optical-fiber bundle 213 for guiding the photoluminescent light, and a TDI sensor 211 for converting the photoluminescent light into an image signal. The focus measure detection sensor section 220a is subdivided into stepped photoluminescent plates 223a, 224a, optical-fiber bundles 225a, 226a, and line sensors 1 (221a), 2 (222a). Similarly, the focus measure detection sensor section 220b is subdivided into stepped photoluminescent plates 223b, 224b, optical-fiber bundles 225b, 226b, and line sensors 1' (221b), 2' (222b). The line sensors 1, 2, 1', 2' are each an independent one-dimensional or two-dimensional line sensor such as a charge-coupled device (CCD). Intermediate surfaces between the stepped photoluminescent plates 223a, 224a, and 223b, 224b, that is, focusing planes of the line sensors 1 and 2 and those of the line sensors 1' and 2' are each set as a focusing plane of the sensor section 210 (TDI sensor 211), wherein the focusing plane (in-focus position: confocal plane conjugate to a plane of convergence of the planar electron beam) works as a light-receiving surface of the photoluminescent plate 212. In other words, an intermediate surface between an image-receiving surface of the line sensor 1 and that of the line sensor 2, and an intermediate surface between an image-receiving surface of the line sensor 1' and that of the line sensor 2' are each set as the focusing plane of the sensor section 210 which detects the inspection image signal. In this way, the line sensors 1, 2 and 1', 2' each have a plurality of focus positions different from one another in focus offset. The sensor section 210 is separated from the sensor sections 220a, 220b, by independent partitions.

Consequently, as shown in FIGS. 4B and 5A, when the irradiation region 230 of the planar electron beam is moved in the plus (+) direction, electron beam image signals for controlling the focus measure are detected by detection regions 242a and 241a of the line sensors 2 and 1, respectively, provided at a forward position of a TDI sensor detection region 250. This allows the focus position from the surface of the sample to be measured at a starting position (a forward position) of inspection region 250.

During the measurement of the focus position, a ratio between electron beam image signal "f1" of the line sensor 1 (221a) and electron beam image signal "f2" of the line sensor 2 (222a) becomes a function of a shift "z" that the light-receiving surface of the sensor section 210 is shifted from the in-focus position. That is, attention is to be focused on the fact that the ratio between the two electron beam image signals is represented as R(z)=f1/f2. Prior to the inspection, the ratio R(z) between the two electron beam image signals is calculated using a calibration region, then an inverse function $R^{-1}$ of R(z) is further calculated, and both calculation results are stored into a look-up table. During the inspection, the shift "z" that the light-receiving surface of the sensor section 210 is shifted from the in-focus position, is calculated as "z=$R^{-1}$(f1/f2)" from the electron beam image signals "f1", "f2" that have been obtained from the line sensors 1, 2, respectively.

In addition, as shown in FIGS. 4B and 5B, when the irradiation region 230 of the planar electron beam is moved in the minus (−) direction, electron beam image signals for controlling the focus measure are detected by detection regions 241b and 242b of the line sensors 1' and 2', respectively, provided at forward position of the TDI sensor detection region 250. This allows the focus position from the surface of the sample to be measured at the starting position (at the forward position) of inspection region 250.

During the measurement of the focus position, a ratio between electron beam image signal "f1'" of the line sensor 1' (221b) and electron beam image signal "f2'" of the line sensor 2' (222b) becomes a function of a shift "z" that the light-receiving surface of the sensor section 210 is shifted from the in-focus position. That is, attention is to be focused on the fact that the ratio between the two electron beam image signals is represented as R(z)=f1'/f2'. Prior to the inspection, the ratio R(z) between the two electron beam image signals is calculated using a calibration region, then an inverse function $R^{-1}$ of R(z) is further calculated, and both calculation results are stored into the look-up table. During the inspection, the shift "z" from the in-focus position on the light-receiving surface of the sensor section 210 is calculated as "z=$R^{-1}$(f1'/f2')" from the electron beam image signals "f1'", "f2'" that have been obtained from the line sensors 1', 2', respectively.

Table 1 below summarizes the way the above-described sensors are used.

TABLE 1

| | Purpose of use | In-focus position | Relationship with the moving direction of the beam |
|---|---|---|---|
| Line sensor 1 | Focusing | Low | Using at movement in + direction |
| Line sensor 2 | Focusing | High | Using at movement in + direction |
| Line sensor 1' | Focusing | Low | Using at movement in − direction |
| Line sensor 2' | Focusing | High | Using at movement in − direction |
| TDI sensor | Inspection image detection | — | — |

The focus position can be measured at the starting position (the forward position) of inspection region 250 in this manner, so the measured focus position can be fed back to focus adjustment in the inspection region 250.

Next, a total sequence in the second embodiment will be described using FIGS. 6A and 6B. Of course, this total sequence is applicable to the first embodiment.

Figure 6A:
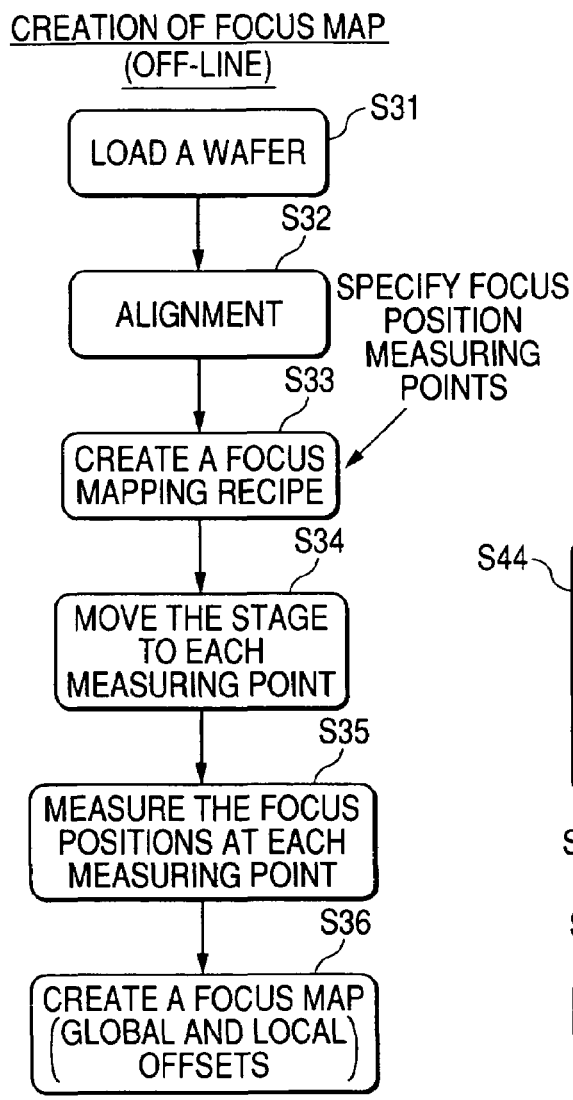
FIG. 6A is a focus map creation flow diagram showing an example of a total focus position control sequence in the projection electron microscopy-based electron beam inspection apparatus.
Figure 6B:
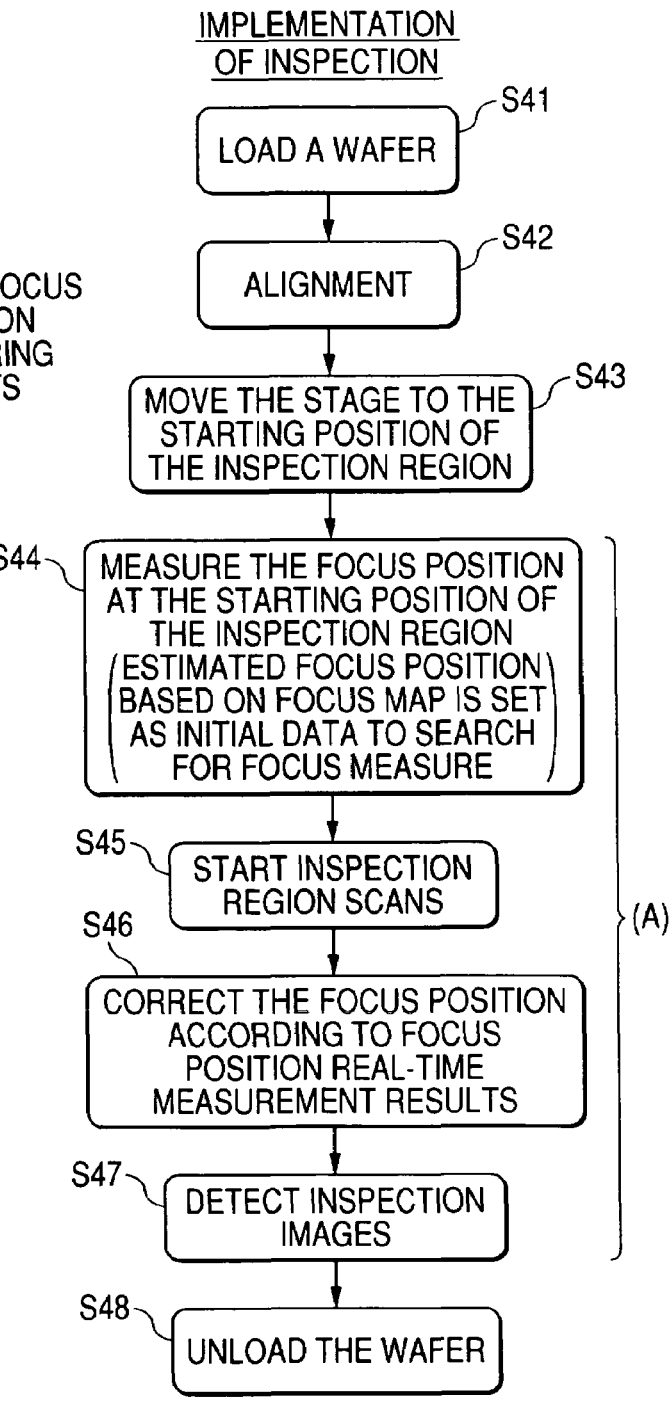
FIG. 6B is an inspection implementation flow diagram showing an example of a total focus position control sequence in the projection electron microscopy-based electron beam inspection apparatus.

A focus mapping procedure to be used off-line in advance is first described using FIG. 6A. First, samples 107a for which a focus map is to be created are mounted on the sample-moving stage 108 sequentially in step S31. After this, alignment optics is used to align the sequentially mounted samples 107a in step S32. Next in step S33, the total control unit 16 displays layout data relating to dies of each sample and circuit patterns in each of the dies, on a screen of the display device 162. The layout data is stored into the storage device 163 beforehand. In step S33, the total control unit 16 also creates a focus map recipe for the samples in accordance with the measuring points specified on the screen to measure focus positions for each inspection region, for example, and then registers the created recipe in the storage device 163. Next in step S34, the total control unit 16 moves the sample-moving stage 108 via the stage controller 153 in accordance with the created focus map recipe for the samples and positions the stage 108 at each measuring point specified for each inspection region, for example, on one of the samples 107a. The total control unit 16 first uses the optical height detection sensor 117 to measure and detect reference height at the particular measuring point. Additionally, as shown in FIG. 2, the total control unit 16 sequentially sets in the focus position controller 152 a plurality of mutually different heights (focus offsets) for the focus position of the objective lens 106, with the reference height as reference. If the sample-moving stage 108 has a Z-stage, the surface of the sample can also be adjusted to the above reference height. Next, the focus position controller 152 sequentially changes the focus position to the sequentially set plural heights mentioned above, the electron irradiation optics 11 irradiates each measuring point with a planar electron beam 310, and the sensor unit 200a or the sensor section 220a or 220b detects the secondary electron beam image or mirror electron beam image resultingly obtained from the surface of the sample at the particular measuring point. The focus measure calculation unit (focus measure measuring section) 141 measures focus measure from the detected electron beam image signal and the focus position calculation unit 142 calculates height of a confocal plane conjugate to a plane of convergence of the planar electron beam in relation to the electron-imaging optics 13, on the basis of the measured focus measure. Thus, in step S35, in-focus position (focus position) of the objective lens 106 is calculated and is measured so that the sensor section 210 in the sensor section 200a or 200b detects a focusing inspection image of an inspection region of the sample surface on the basis of the calculated height of the confocal plane. For the sensor unit 200b shown in FIGS. 3 and 4A, a midpoint between the stepped photoluminescent plates of the focus measure detection sensor 220a or 220b becomes a light-receiving surface for the focusing inspection image at the sensor unit 200. Thus, in step S36, a focus map of the in-focus positions (focus positions) of the objective lens at each measuring point specified for each die arranged in the samples is created within the total control unit 16 as results of the calculation with the focus position calculation unit 142, and then stored into the storage device 163. The focus map includes sample-by-sample global offset maps $G_{global}(x, y)$ and intra-die local offsets $G_{local}(x, y)$.

Figure 8:
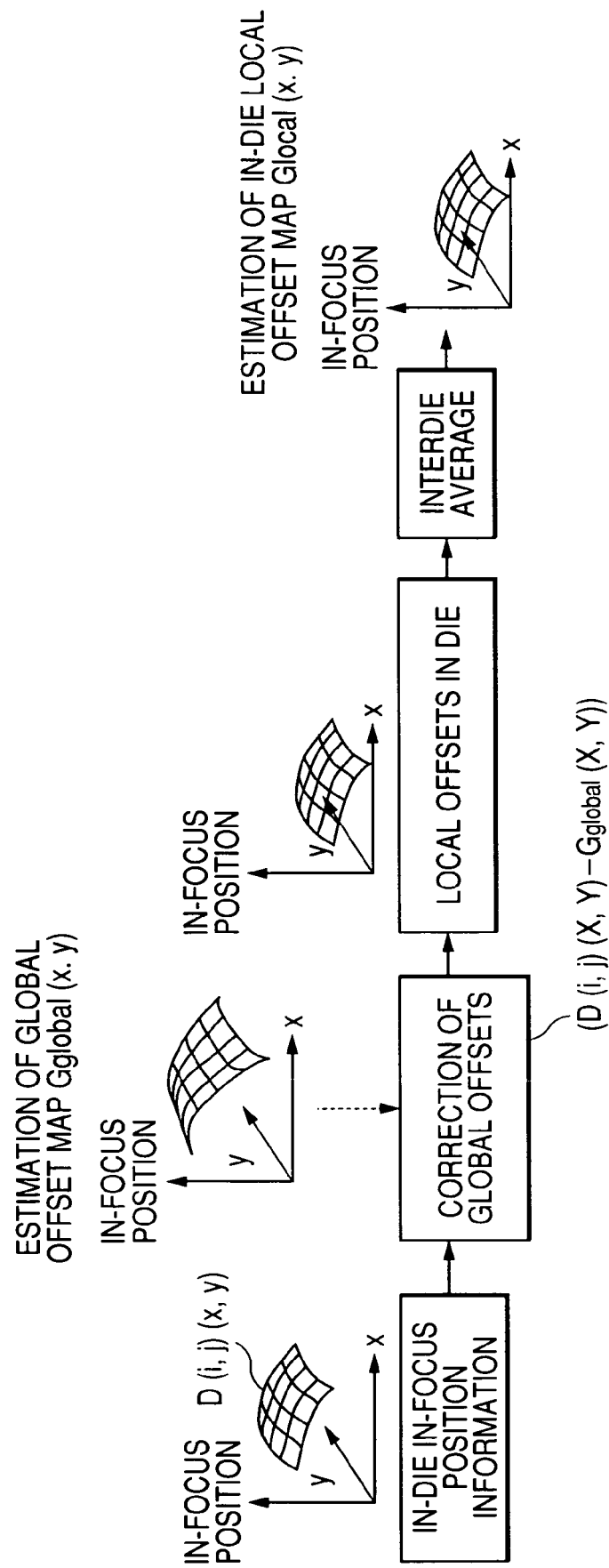
FIG. 8 is an explanatory diagram on estimation of off-line intra-die local focus offsets with respect to various samples (wafers) in the present invention.

Each global offset map $G_{global}(x, y)$ that indicates global focus offsets due to, for example, differences in an electrical charge state of the sample interior, is obtained by collecting in-focus position information $D_{(i,j)}(x, y)$ of the same intra-die coordinates (x, y), from the multiple dies (i, j) arranged in each sample, and then averaging the collected in-focus position information between the dies. This state is shown in FIG. 7. For the intra-die local offset maps $G_{local}(x, y)$ that are indicated by local focus offsets due to the differences in the electrical charge state of the die interior, intra-die local offsets for each of the multiple dies (i, j) arranged in each sample are determined by subtracting (correcting) the global offset map $G_{global}(x, y)$ from the intra-die in-focus position information $D_{(i,j)}(x, y)$ of each die. The intra-die local offset maps $G_{local}(x, y)$ is obtained by averaging the determined intra-die offsets over the multiple dies (i, j). This state is shown in FIG. 8, where (i, j) denotes a layout position of the die within the sample (wafer) and (x, y) denotes internal position coordinates of the die.

The focus map shown in expression (1) below is thus created off-line for the intra-sample detection points (i, j) (x, y) estimated for each sample. This allows the estimated focus position at the starting position of the inspection region to be set as an initial value for in-focus point searching.

Estimated in-focus position value at inspection point:

$$F(i,j;x,y)=S(i,j;x,y)+G_{global}(x,y)+G_{local}(x,y) \quad (1)$$

where S (i, j; x, y) is an estimated surface height value of the sample, based on the measurement with the optical height detection sensor 117.

While off-line prior creation of a focus map for samples has been described above, such a map may likewise be created by using an inspection execution history of the past.

Next, how the focus position is corrected when an inspection is actually conducted will be described below using FIG. 6B. First, a sample (wafer) 107 to be inspected is mounted on the sample-moving stage 108 in step S41. After this, alignment optics (not shown) is used to align the mounted sample 107 in step S42. Next in step S43, the total control unit 16 controls the sample-moving stage 108 via the stage controller 153 and moves the stage 108 to a starting position of an inspection region of the sample 107. In step S44, the total control unit 16 first reads out a stored focus map of the corresponding sample from the storage device 163, and sets an estimated focus position "F (i, j; x, y)" at a measuring point corresponding to the inspection region in the focus position controller 152 as initial data of focus offsets which are to be subjected to in-focus searching based on a reference height "s (i, j; x, y)" measured by the optical height detection sensor 117. After that, the electron irradiation optics 11 irradiates the starting position of the inspection region with a planar electron beam 310 at the above-set focus offset position of the objective lens 106 (as shown in FIG. 2, multiple focus offset positions of different heights may be adopted instead of the set focus offset position), and the sensor unit 200a or the sensor section 220a or 220b detects the secondary electron beam image or mirror electron beam image obtained as a result from the starting position of the inspection region to measure a focus position (in-focus position) "f (i, j; x, y)" at the starting position of the inspection region. In step S45, the total control unit 16 moves the sample-moving stage 108 in a scanning direction via the stage controller 153 and starts scanning the inspection region with the planar electron beam 310. Additionally in step S46, the total control unit 16 conducts focus position corrections by controlling, for example, the focus correction coils 119, 120 via the focus position controller 152 based on real-time measurement of focus position "f". Continuously, the sensor section 210 in the sensor unit 200a or the sensor unit 200b detects an inspection image signal of the inspection region in step S47. The total control unit 16 repeats the above steps S44 to S47 for each inspection region (die-corresponded region) at a detection width (longitudinal dimension of the TDI sensor) on the sample (wafer) 107 by moving the sample-moving stage 108. In step S48, the sample will be unloaded from the stage 108 when the entire region of the sample 107 is scanned and irradiated with planar electron beams and detection of inspection image signals is completed.

Next, auto-focusing during inspection is described below. The description, for simplicity thereof, assumes that a position at which an inspection has already been conducted (a detected focus position) is defined as (x), and the next inspection position (inspection image detection position) as (x+1), in one die. In this latter definition, +1 is equivalent to a travel distance through which the sample is moved according to a particular delay in the processing time required for in-focus position calculation based on an electron beam image signal detected by the sensor unit 200a or the sensor section 220a or 220b.

An estimated in-focus position value F(x+1) of the next inspection position (x+1) is created as a focus map in accordance with expression (2) below based on the above expression (1).

$$F(x+1)=S(x+1)+G_{global}(x+1)+G_{local}(x+1) \quad (2)$$

where S(x+1) is an estimated value of the sample surface height at the next inspection position (x+1), $G_{global}(x+1)$ is estimated global focus offset data due to, for example, differences in an internal electrical charge condition of the sample at the next inspection position (x+1), and $G_{local}(x+1)$ is estimated local focus offset data due to differences in an internal electrical charge condition of a die at the next inspection position (x+1).

Meanwhile, during the inspection, at the above-defined previous inspection position (x), surface height "s (x)" of the sample is measured by the optical height detection sensor 117 and at the same time, an in-focus position "f (x)" based on the electron beam image is measured in accordance with expression (3) below by the sensor unit 200a or the sensor section 220a or 220b. The thus-measured surface height and in-focus position are stored into the storage device 163.

$$f(x)=s(x)+g(x) \quad (3)$$

Figure 9:
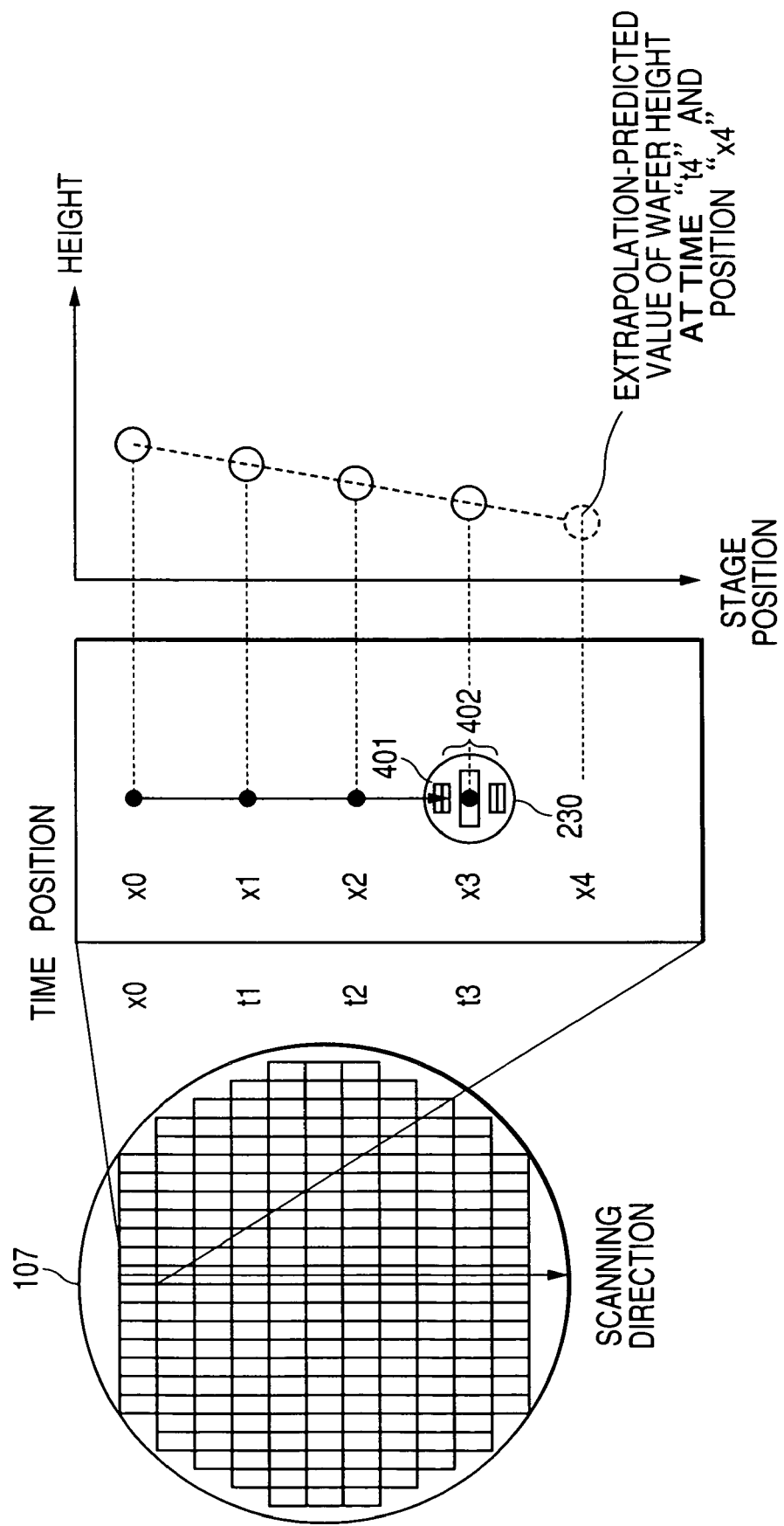
FIG. 9 is an explanatory diagram on estimation of surface height of a sample when the sample is scanned and irradiated with a planar electron beam in the present invention.

Accordingly, since the sample is moved according to the particular delay in the above processing time, it becomes necessary for the total control unit 16 to forecast an in-focus position (surface height of the sample) at the next detection position (inspection image detection position) expressed as (x+1), based on the in-focus position "f(x)" calculated by detection at the above-defined previous detection position (x). FIG. 9 shows a state in which planer electron beams was already scanned at positions from x0 to x3 (i.e., at the time of day from t0 to t3) in a required scanning direction in the die of the sample and will be scanned to a next position x4. In such a case, after the detection and calculation of the previous detection position (x), the total control unit 16 conducts an extrapolation as below to forecast the in-focus position (surface height of the sample) at the next detection position (x+1). That is to say, by conducting an extrapolation based on the value of the above expression (3) that was measured at the previous detection position (x), the total control unit 16 calculates the estimate S (x+1) of the sample surface height at the next inspection position (x+1), the estimate $G_{global}(x+1)$ of the global focus offset data associated with the next inspection position (x+1), and the estimate $G_{local}(x+1)$ of the local focus offset data associated with the next inspection position (x+1), and forecasts the in-focus position at the next detection position (x+1) in accordance with expression (2). These forecasts allow the focus position controller 152 to detect the inspection image in an in-focus condition via the sensor unit 200 by controlling, for example, the focus correction coils 119, 120, at the next detection position (inspection image detection position) (x+1).

The circle ○ in FIG. 9 indicates height relative to the stage position. That is to say, symbol ○ indicates the surface height of the sample that is detected by the optical height detection sensor 117. The dotted line in FIG. 9 indicates the extrapolation. Reference number 401 denotes the irradiation region 230 of the planar electron beam at the time of day, "t3". Reference number 402 denotes the inspection region 250 at the time "t3". As mentioned above, the irradiation region 230 of the planar electron beam is formed as a rectangular region or the like.

Third Embodiment

Figure 10:
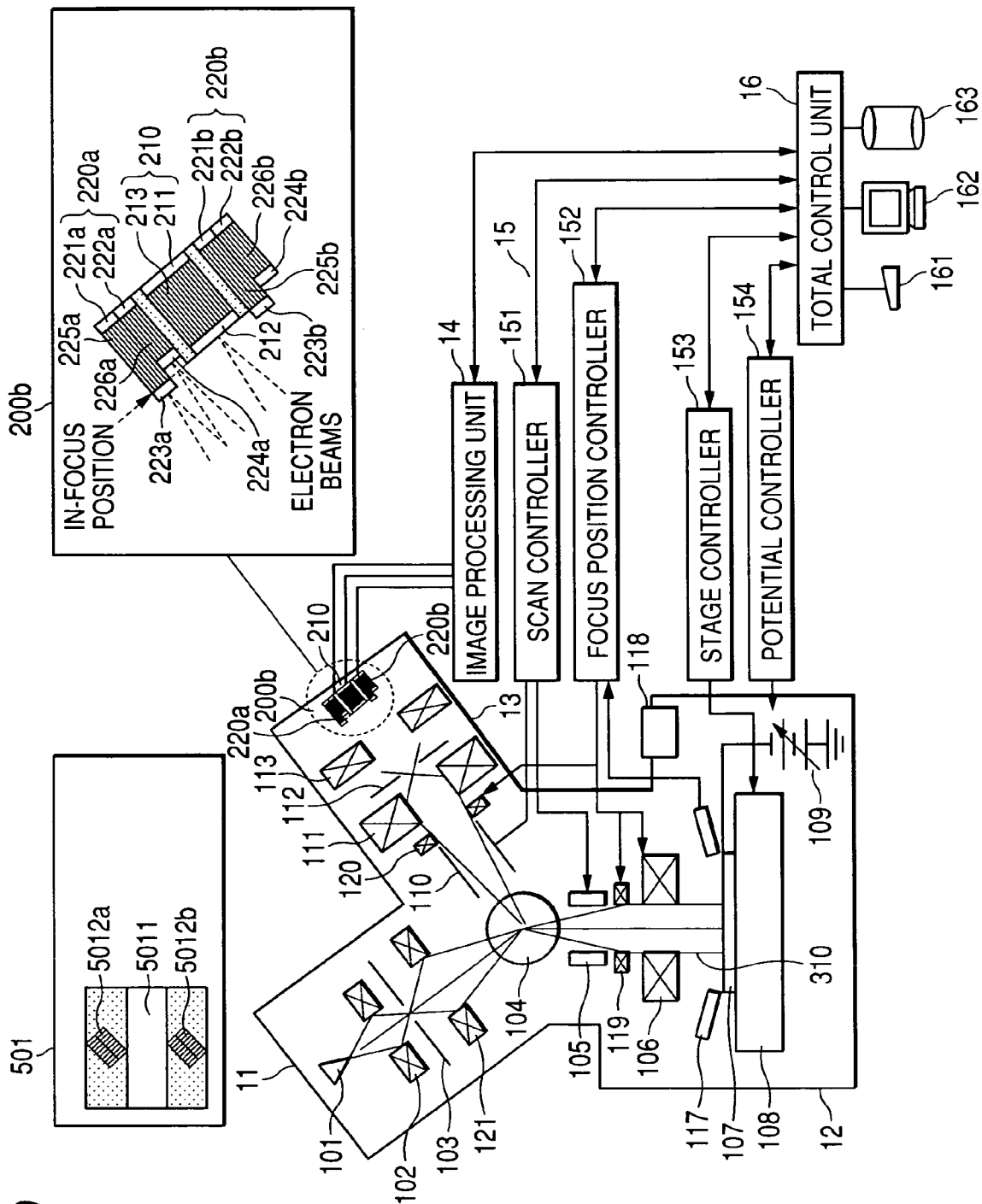
FIG. 10 is a total configuration diagram of a third embodiment of a projection electron microscopy-based electron beam inspection apparatus according to the present invention, this total configuration diagram also showing a sensor unit in enlarged view.
Figure 11A:
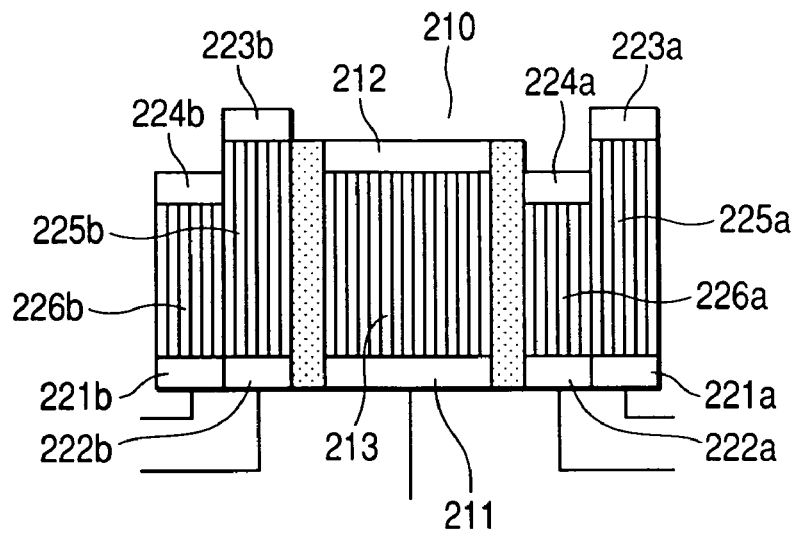
FIG. 11A is a front, sectional view of the sensor unit in the third embodiment of the present invention.
Figure 11B:
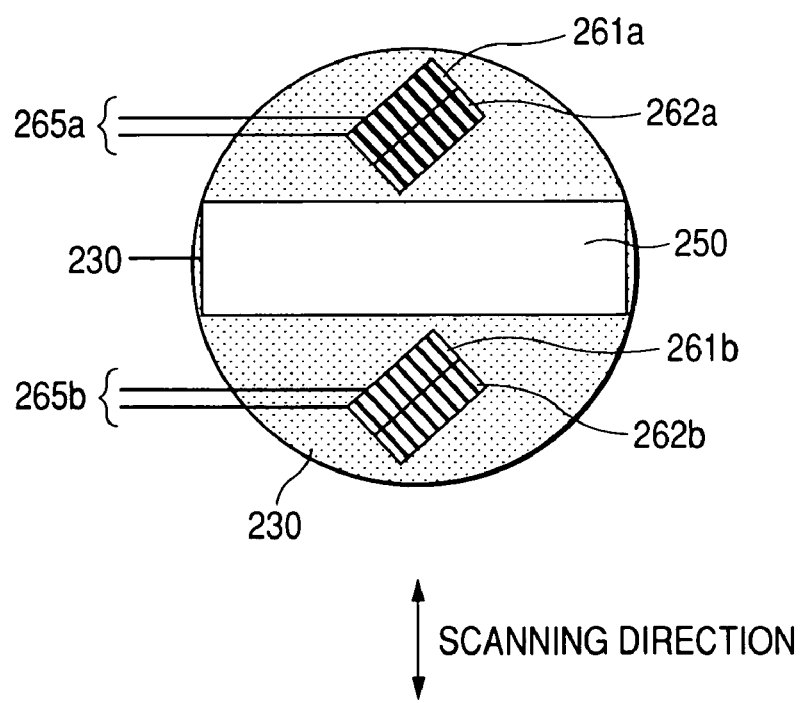
FIG. 11B is a diagram showing a positional relationship between a detection region of a TDI sensor and detection regions of line sensors in a planar electron beam irradiation region according to the third embodiment.

Next, a third embodiment of a projection electron microscopy-based electron beam inspection apparatus according to the present invention is described below using FIGS. 10, 11A and 11B. FIG. 10 is a total configuration diagram with both a slit and a sensor unit shown in enlarged form. FIGS. 11A and 11B are views that show relationships in position between various sensors and detection regions.

The third embodiment differs from the second embodiment in that the former has a slit 501, instead of the diaphragm 103 in the latter, with oblique striped patterns 5012a, 5012b on both sides of an aperture 5011. As shown in FIG. 11B, therefore, detection regions 261a and 262a of line sensors 1 and 2, respectively, and detection regions 261b and 262b of line sensors 1' and 2', respectively, require matching to oblique-stripe-patterned electron beam irradiation regions 265a and 265b inclined with respect to a scanning direction of a sample whose surface is to be irradiated.

According to the third embodiment, constructing the apparatus in that way makes it possible, even for a textured or plain-colored sample surface, to detect high-contrast electron beam image signals for in-focus point detection, from the detection regions 261a, 262a of the line sensors 1, 2 and the detection regions 261b, 262b of the line sensors 1', 2', and to exercise in-focus point control. In addition, even if circuit patterns are formed on a seed (underlying) layer, since the striped patterns are inclined with respect to main directional components of those circuit patterns, the high-contrast electron beam image signals for in-focus point detection can be detected from the detection regions 261a, 262a of the line sensors 1, 2 and the detection regions 261b, 262b of the line sensors 1', 2', without being affected by the circuit patterns on the seed (underlying) layer. In-focus point control can be accurately executed as a result.

The way the sensors are used is essentially the same as in Table 1.

Fourth Embodiment

Figure 12:
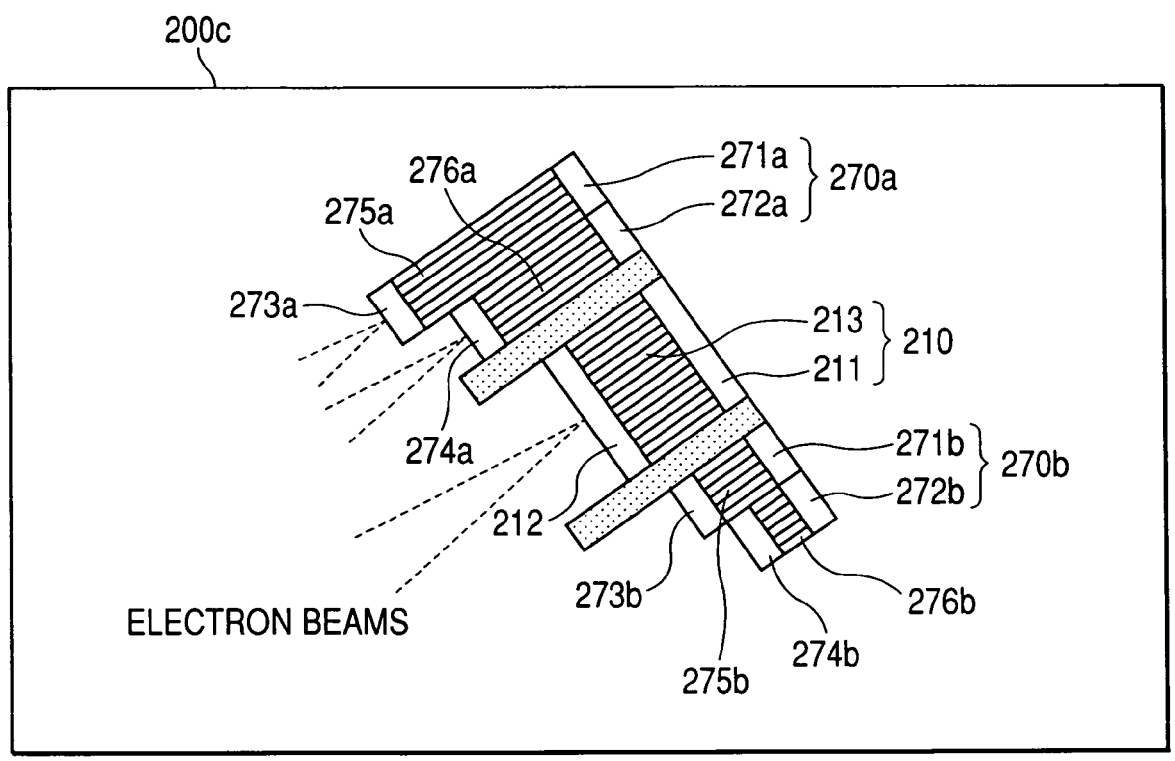
FIG. 12 is an enlarged view of a sensor unit in a fourth embodiment of a projection electron microscopy-based electron beam inspection apparatus according to the present invention.
Figure 13A:
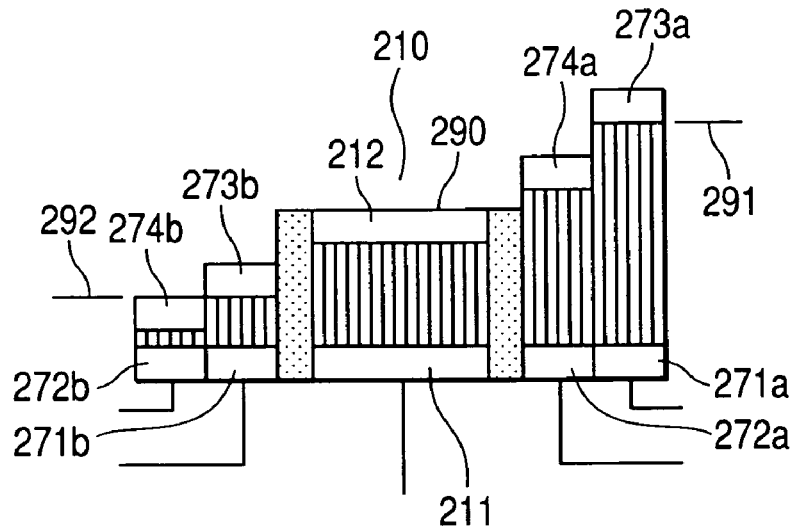
FIG. 13A is a front, sectional view of the sensor unit in the fourth embodiment of the present invention.
Figure 13B:
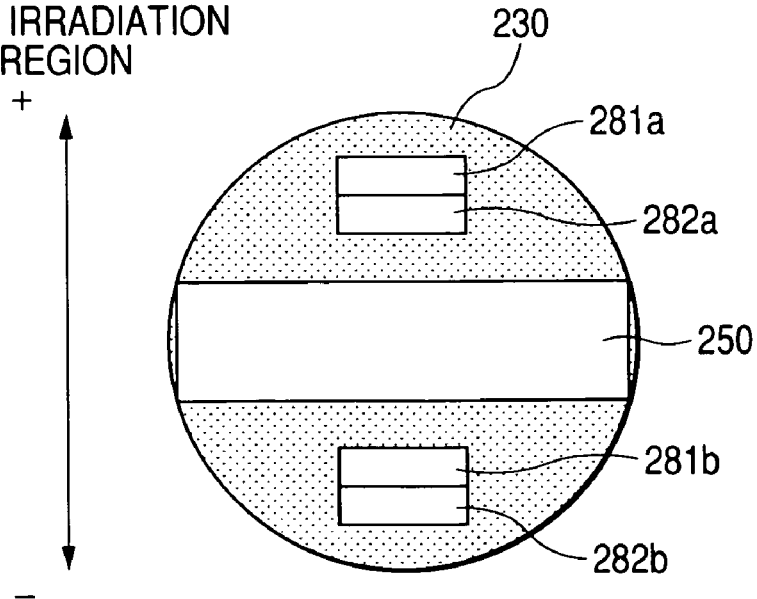
FIG. 13B is a diagram showing a positional relationship between a detection region of a TDI sensor and detection regions of line sensors in a planar electron beam irradiation region according to the fourth embodiment.
Figure 15:
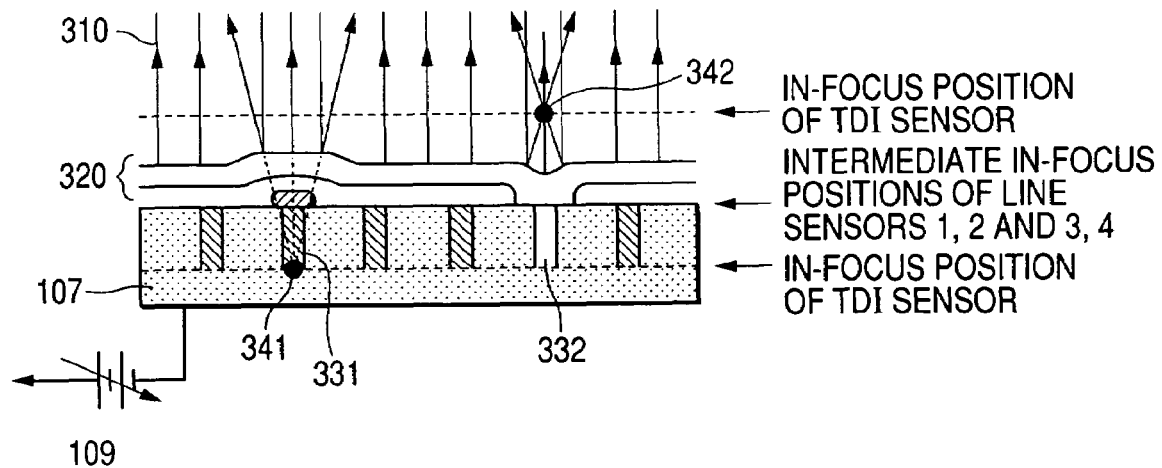
FIG. 15 is a diagram illustrating in principle how various defects are detected by focusing to various defects in a case of mirror electron detection of the fourth embodiment of the present invention.

Next, a fourth embodiment of a projection electron microscopy-based electron beam inspection apparatus according to the present invention is described below using FIGS. 12 to 15. FIG. 12 is an enlarged view of a sensor unit 200c. FIGS. 13A and 13B are diagrams that show positional relationships between sensors and detection regions. FIGS. 14A and 14B are diagrams that show differences in focusing control operation according to a particular moving direction of a planar electron beam. FIG. 15 is a diagram that illustrates how a negatively charged defect and a positively charged defect are detected using mirror electrons. The fourth embodiment differs from the second embodiment in that as shown in FIGS. 12 and 13A, the sensor unit 200c is divided into a sensor section 210 for detecting inspection image signals, and focus measure detection sensor sections 270a and 270b arranged on both sides of the sensor section 210. The sensor section 210 is subdivided into a photoluminescent plate 212, an optical-fiber bundle 213, and a TDI sensor 211. The focus measure detection sensor section 270a is subdivided into stepped photoluminescent plates 273a, 274a, optical-fiber bundles 275a, 276a, and line sensors 1 (271a), 2 (272a). Similarly, the focus measure detection sensor sections 270b is subdivided into stepped photoluminescent plates 273b, 274b, optical-fiber bundles 275b, 276b, and line sensors 3 (271b), 4 (272b). An intermediate surface 291 between the stepped photoluminescent plates 273a, 274a, is formed so as to be shifted in a plus direction from a light-receiving surface 290 of the photoluminescent plate 212 in the sensor section 210. An intermediate surface 292 between the stepped photoluminescent plates 273b, 274b is formed so as to be shifted in a minus direction from the light-receiving surface 290 of the photoluminescent plate 212 in the sensor section 210. In this way, the line sensors 1, 2 and 3, 4 each have a plurality of focus positions different from one another in focus offset. Reference number 281a denotes a detection region of the line sensor 1 (271a), and 282a a detection region of the line sensor 2 (272a). Likewise, 281b denotes a detection region of the line sensor 3 (271b), and 282b a detection region of the line sensor 4 (272b). Reference number 250 denotes a detection region of the TDI sensor 211.

Hence, as shown in FIGS. 13B and 14A, an inspection electron beam image formed by imaging optics 106, 119, 120, 111-113 during movement of an irradiation region 230 of a planar electron beam 310 in a plus (+) direction, that is, movement of an associated sample in a minus (−) direction, when a plane that has been shifted in the plus direction from the surface of the sample is taken as a focusing plane of the TDI sensor, can be detected as an inspection image signal using the TDI sensor 211. Also, as shown in FIGS. 13B and 14B, an inspection electron beam image formed by the imaging optics 106, 119, 120, 111-113 during movement of the irradiation region 230 of the planar electron beam 310 in the minus (−) direction, that is, movement of the sample in the plus (+) direction, when a plane that has been shifted in the minus direction from the surface of the sample is taken as the focusing plane of the TDI sensor, can be detected as an inspection image signal using the TDI sensor 211.

Shifting the focusing plane of the TDI sensor in the plus and minus directions in this manner provides suitability for detecting a negatively charged defect (convex defect) and a positively charged defect (concave defect) with mirror electrons, as shown in FIG. 15. FIG. 15 is a schematic representation of the way where a planar electron beam 310 perpendicularly incident on an equipotential plane 320 near a top layer of the sample 107 is drawn backward by an electric field. Since defects 331 and 332 are present on the surface of the sample 107, the equipotential plane 320 takes a nonuniform shape at which the defects are present. Accordingly, the perpendicularly incident electron beam is not drawn backward in its original perpendicular direction. Instead, the electron beam is drawn backward at an angle as shown, and enters the lenses including the objective lens 106 and the imaging lens 111. As a result, bright images of the defects 331 and 332 are formed in a concentrated condition on an imaging surface 112, that is, on the photoluminescent plate 212 of the sensor section 210.

Therefore, if the defect is a negatively charged defect (convex defect) 331, a focus position (in-focus position) 341 is moved below the surface of the sample 107 (i.e., shifted in a minus direction) and the electron beam is drawn backward as if it were given a certain angle in order for mirror electrons to be generated from the focus position 341. Thus, the convex defect is imaged on the imaging surface 112 and an image of the defect is detected. If the defect is a positively charged defect (concave defect) 332, a focus position (in-focus position) 342 is moved above the surface of the sample 107 (i.e., shifted in a minus direction) and the electron beam is drawn backward as if it were given a certain angle in order for mirror electrons to be generated from the focus position 342. Thus, the concave defect is imaged on the imaging surface 112 and an image of the defect is detected. For these reasons, if an in-focus position 290 of the TDI sensor is adjusted to the negatively charged defect 331, the mirror electrons drawn backward from the positively charged defect 332 will not be imaged on the imaging surface 112 and an image of a section darker than a normal surface will be consequently detected. Conversely, if the in-focus position 290 of the TDI sensor is adjusted to the positively charged defect 332, the mirror electrons drawn backward from the negatively charged defect 331 will not be imaged on the imaging surface 112 and an image of a section darker than a normal surface will be consequently detected. In addition, the in-focus position (focusing plane) will change according to a particular size of the convex defect or of the concave defect. Further preferably, therefore, line sensors 250*a*, 250*b* are constructed so as to be micromovable in a height direction thereof with respect to an installation base (not shown) for the TDI sensor 210.

Furthermore, according to the fourth embodiment, when the irradiation region 230 of the planar electron beam is moved in a plus (+) direction with respect to the sample 107, the focusing plane of the TDI sensor is shifted in a minus direction from the intermediate in-focus position of the line sensors 1 and 2 that is detected as an in-focus position of a normal equipotential plane. Therefore, the negatively charged defect 331 is detected since the focusing plane of the TDI sensor is adjusted to the focus position 341 of the defect 331. Conversely, when the irradiation region 230 of the planar electron beam is moved in a minus (−) direction with respect to the sample 107, the focusing plane of the TDI sensor is shifted in a plus direction from the intermediate in-focus position of the line sensors 3 and 4 that is detected as an in-focus position of a normal equipotential plane. Therefore, the negatively charged defect 332 is detected since the focusing plane of the TDI sensor is adjusted to the focus position 342 of the defect 332.

Figure 16:
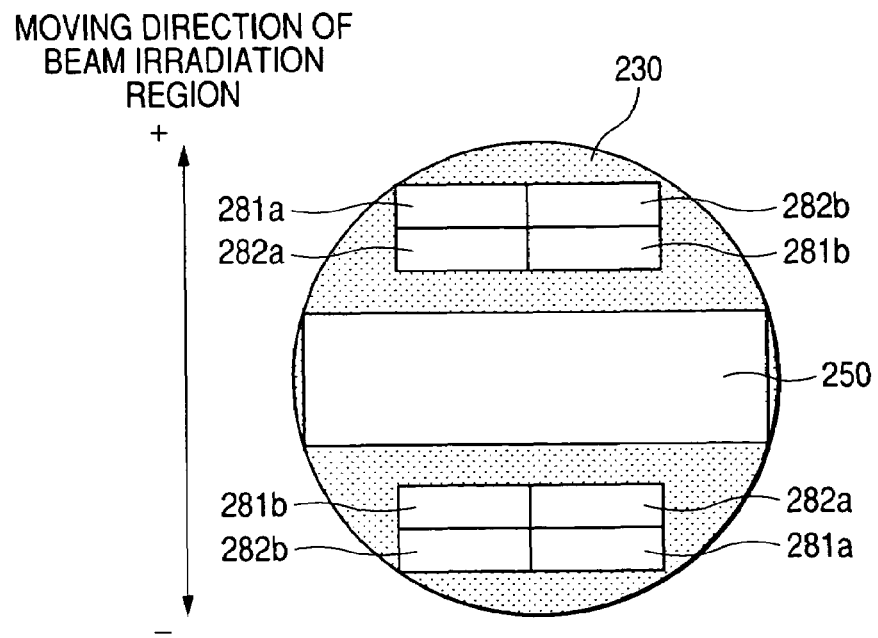
FIG. 16 is a diagram showing four detection regions in a modification of the fourth embodiment of the present invention.

As described above, although the kind of defect to be detected was changed according to the particular moving direction of the sample, providing an additional line sensor section 270*a* (line sensors 1, 2) at the line sensors 3, 4 and an additional line sensor section 270*b* (line sensors 3, 4) at the line sensors 1, 2, to form four line sensor detection regions (two pairs: 281*a*, 282*a*, and 281*b*, 282*b*) as shown in FIG. 16, and repeating the scanning of the sample twice in the plus and minus directions allows the detection of both the negatively charged defect (convex defect) 331 and positively charged defect (concave defect) 332 that differ in focus position.

As described above, according to the fourth embodiment, since at least two inspection image signals each having a different in-focus position are detected, high-sensitivity judgment between the negatively charged. defect 331 and the positively charged defect 332 is possible by comparing the inspection image signals with a defect-free reference image signal via a defect judgment unit 145 provided inside an image processing unit 14.

Fifth Embodiment

Figure 17:
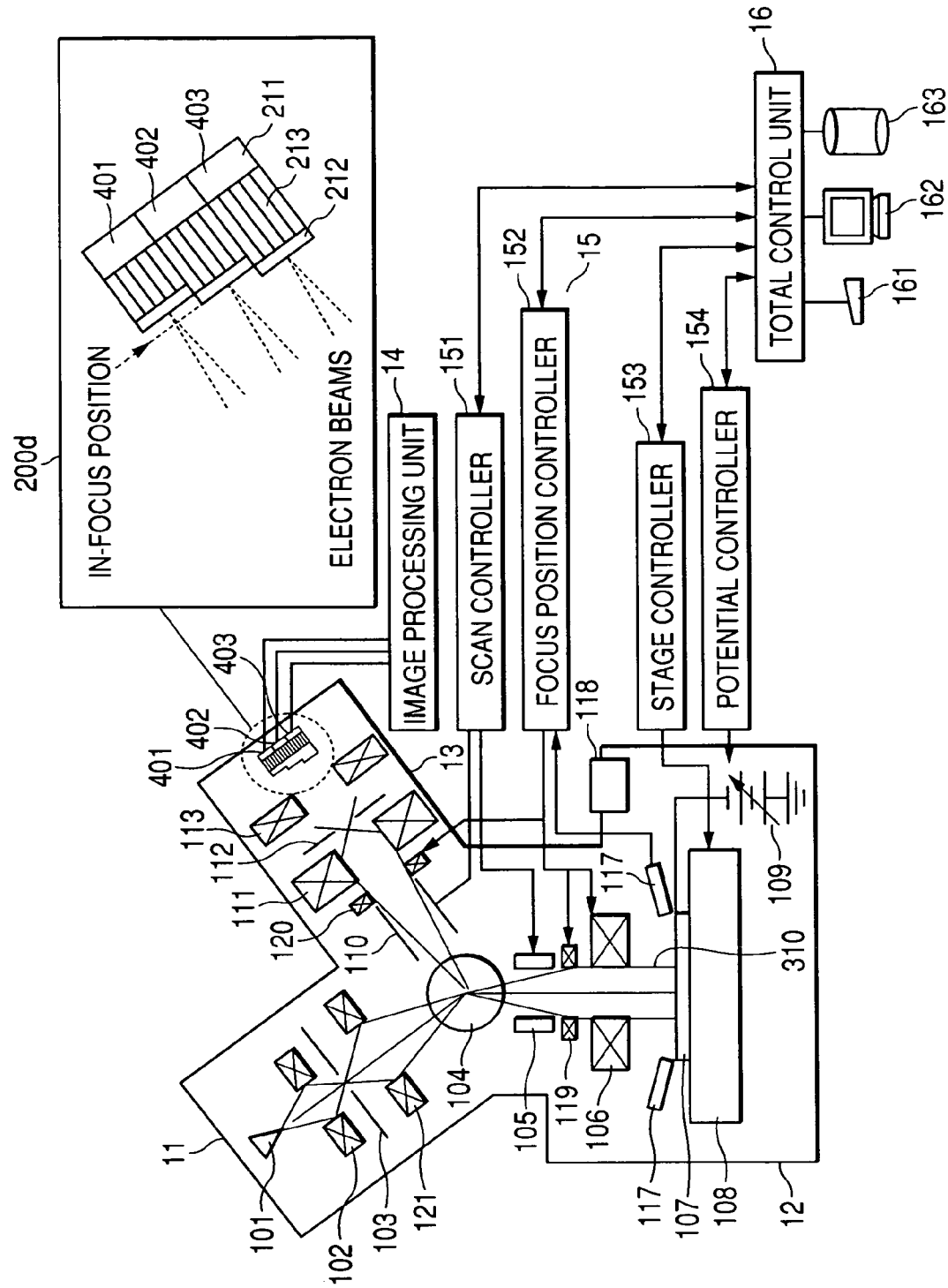
FIG. 17 is a total configuration diagram of a fifth embodiment of a projection electron microscopy-based electron beam inspection apparatus according to the present invention, this total configuration diagram also showing a sensor unit in enlarged view.
Figure 18:
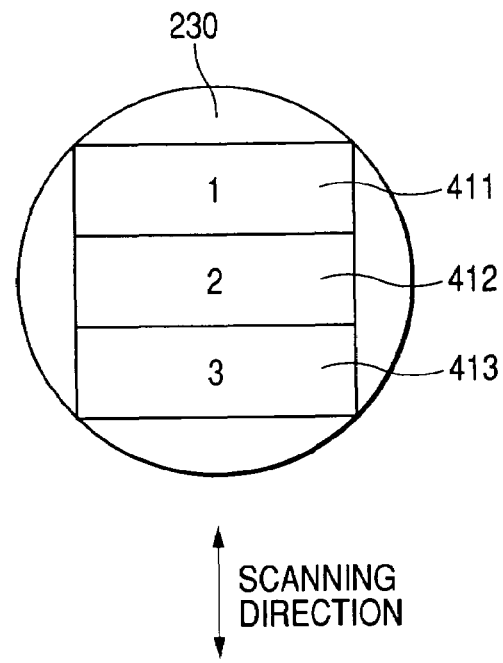
FIG. 18 is a diagram that shows detection regions of TDI sensors in the fifth embodiment of the present invention.
Figure 19:
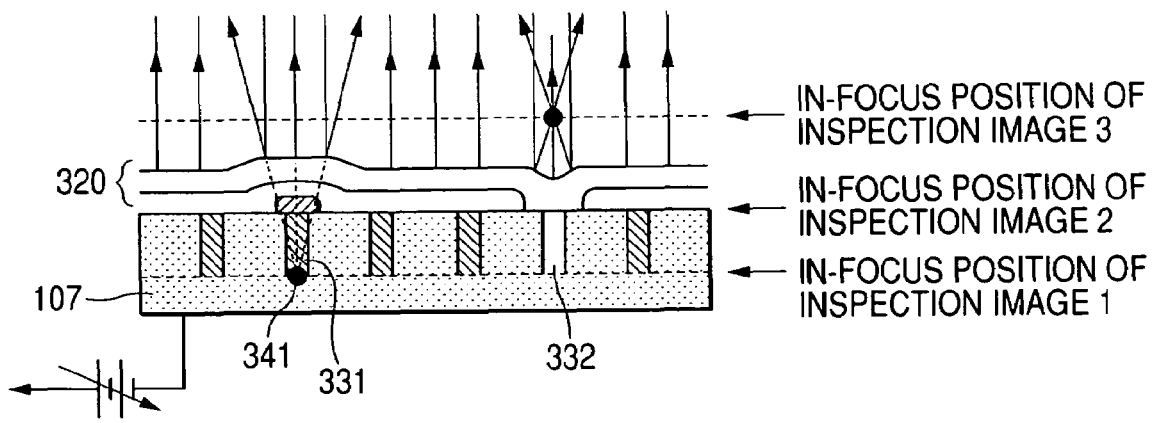
FIG. 19 is a sectional view of a sample and neighborhood thereof, this view showing a positional relationship between various defects and in-focus positions of TDI sensors in a case of mirror electron detection of the fifth embodiment of the present invention.
Figure 20:
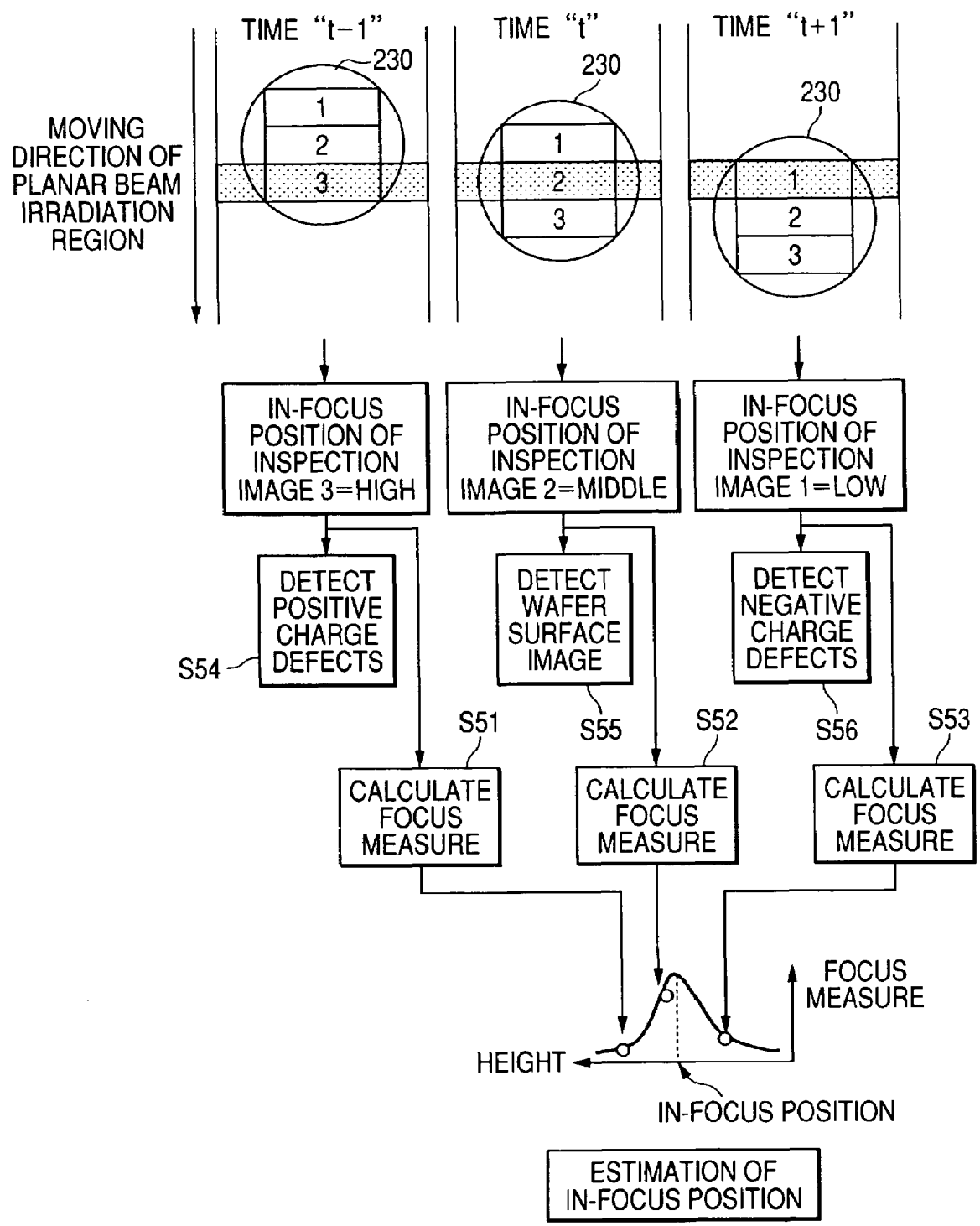
FIG. 20 is a diagram that shows calculation flow of focus measure in the fifth embodiment of the present invention.

Next, a fifth embodiment of a projection electron microscopy-based electron beam inspection apparatus according to the present invention is described below using FIGS. 17 to 20. FIG. 17 is a total configuration diagram, also showing a sensor unit 200*d* in a large scale. FIG. 18 is a diagram that shows detection regions of sensors. FIG. 19 is a diagram that shows in-focus positions of each sensor during mirror electron detection. FIG. 20 is a diagram that shows an in-focus position calculation flow.

The fifth embodiment differs from the second embodiment in that a plurality of TDI sensor sections 401, 402, 403, each different in in-focus position, are arranged next to one another to constitute the sensor unit 200*d*. Each TDI sensor section includes a TDI sensor 211, a photoluminescent plate 212, and an optical-fiber bundle 213. The photoluminescent plates 212 of each TDI sensor section that function as light-receiving surfaces are each constructed with a specific difference in height so as to have a different in-focus position. Detection regions 411, 412, 413 of the TDI sensors, therefore, are formed as in FIG. 18.

Consequently, as shown in FIG. 19, images generated by reflection of the mirror electrons from an equipotential plane 320 near a top layer of a sample 107 when an irradiation region 230 is irradiated with a planar electron beam 310 can be detected almost simultaneously from the TDI sensors 1 (401), 2 (402), 3 (403), as inspection images 1, 2, 3 whose in-focus positions differ from one another. The inspection image 1 is an image obtained by focusing on a negatively charged defect (convex defect) 331. The inspection image 2 is an image obtained by focusing on the surface of the sample 107. The inspection image 3 is an image obtained by focusing on a positively charged defect (concave defect) 332. Since the inspection images 1, 2, 3 each having a different in-focus position are detected, high-sensitivity judgment between the negatively charged defect 331, the positively charged defect 332, and other defects, is possible by comparing the inspection images with a defect-free reference image signal via a defect judgment unit 145 provided inside an image processing unit 14.

Next, calculation of in-focus positions in the fifth embodiment is described below using FIG. 20. First, in the same inspection region on the sample, focus measure is calculated at the time of day, "t−1", by the TDI sensor 3, at time "t" by the TDI sensor 2, and at time "t+1" by the TDI sensor 1. At this time, as shown in the enlarged view of FIG. 17, the in-focus position of the TDI sensor 3 is shifted from that of the TDI sensor 2, in a direction of a higher in-focus position, depending on the particular difference in height between the associated TDI sensors. Similarly, the in-focus position of the TDI sensor 1 is shifted from that of the TDI sensor 2, in a direction of a lower in-focus position, depending on the particular difference in height between the associated TDI sensors. Since three sets of focus measure information are thus calculated from the same inspection region (x) on the sample in steps S51, S52, S53, it is possible to calculate the in-focus position "f(x)" denoted as an associated peak position in the above expression (3), and hence to estimate an in-focus position "F(x+1)" associated with the next inspection region (next detection position "x+1"). More specifically, a total control unit 16 conducts an extrapolation as below to forecast the in-focus position (surface height of the sample) at the next detection position (x+1). That is to say, by making an extrapolation based on the value of the above expression (3) that was measured at the previous inspection (detection) position (x), the total control unit 16 calculates an estimate S(x+1) of the sample surface height at the next inspection (detection) position (x+1), an estimate $G_{global}(x+1)$ of global focus offset data associated with the next inspection position (x+1), and an estimate $G_{local}(x+1)$ of local focus offset data associated with the next inspection position (x+1), and forecasts the in-focus position at the next detection position (x+1) in accordance with expression (2). These forecasts allow a focus position controller 152 to detect inspection images in an in-focus condition via the TDI sensors 1, 2, 3 of the sensor unit 200d by controlling, for example, focus correction coils 119, 120, at (x+1), the next inspection position (inspection image detection position). Thus, in step S54, the positively charged defect 332 can be detected in the next inspection region (x+1) on the basis of the inspection image 3 detected at the time "t−1". Likewise, in step S55, an image of the surface of the sample can be detected in the next inspection region (x+1) on the basis of the inspection image 2 detected at the time "t", and in step S56, the negatively charged defect 331 can be detected in the next inspection region (x+1) on the basis of the inspection image 1 detected at the time "t+1".

In the fifth embodiment, since the sensor section that measure focus measure, and the sensor section that detects inspection images employ TDI sensors of the same kind, the detection positions where focus measure is measured are defined as the inspection regions for detecting the inspection images.

According to the fifth embodiment, even if a plurality of heights each different in focus position are not sequentially set for an objective lens 106 or other optics, an electron beam image signal having three points of focus measure data each different in focus position can be obtained from the three TDI sensors, 401, 402, and 403. The electron beam image signal having the three points of focus measure data can therefore be used as a basis for calculation of in-focus positions from characteristics of focus offsets and of the focus measure, as in FIG. 2.

Sixth Embodiment

Figure 21:
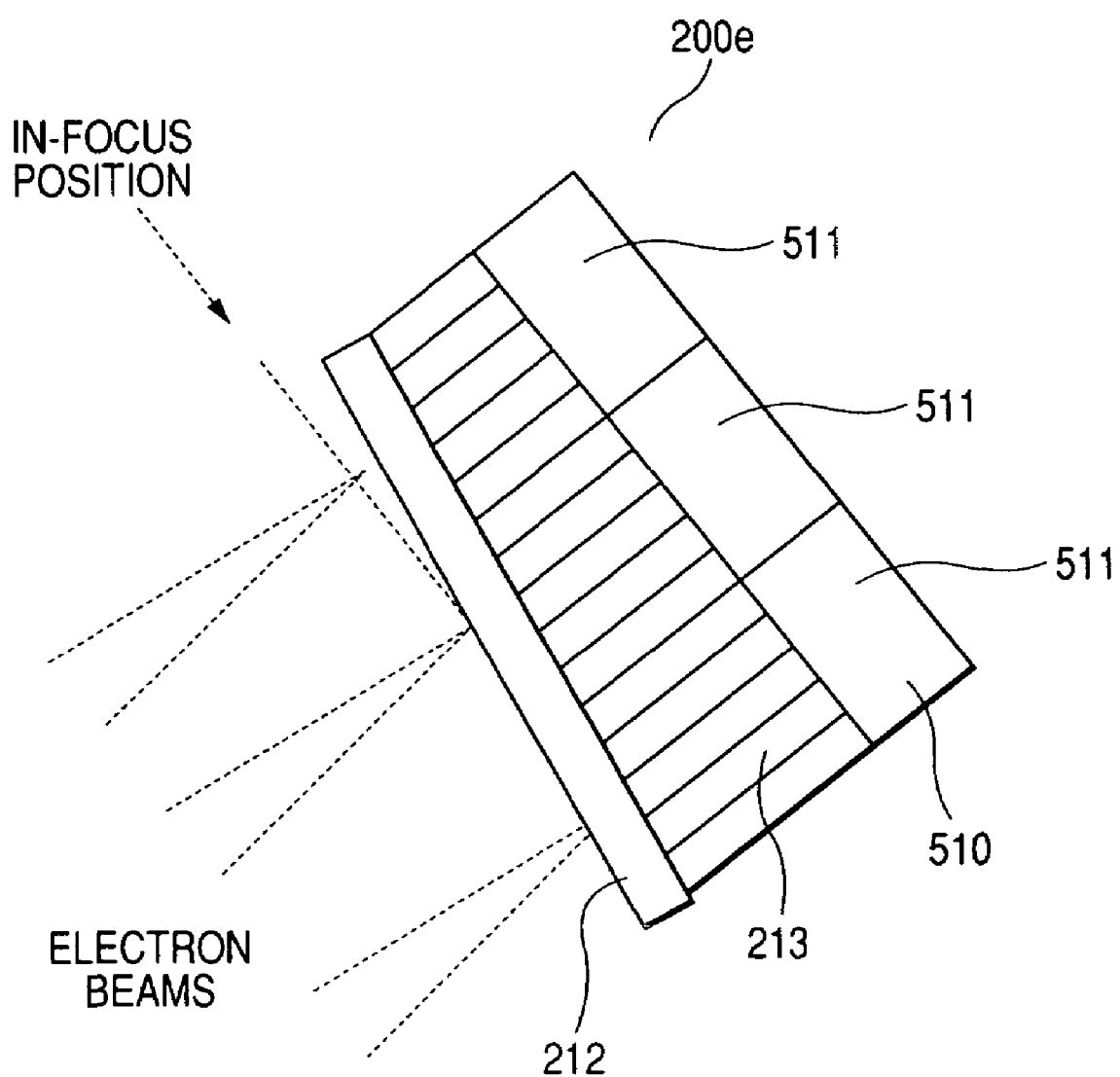
FIG. 21 is an enlarged view of a sensor unit in a sixth embodiment of a projection electron microscopy-based electron beam inspection apparatus according to the present invention.

Next, a sixth embodiment of a projection electron microscopy-based electron beam inspection apparatus according to the present invention is described below using FIG. 21. The sixth embodiment differs from the fifth embodiment in that a plurality of line sensor sections 1 (511), 2 (512), 3 (513), such as one-dimensional or two-dimensional CCDs, are arranged next to one another to constitute a sensor unit 200e, and in that a photoluminescent plate 212 that is a light-receiving surface is inclined. Reference number 510 denotes the line sensor section such as one-dimensional or two-dimensional CCDs, and 213 denotes a section including an optical-fiber bundle. This means that electron beam image signals whose in-focus positions differ can be continuously obtained from each line sensor located ranging from the line sensor section 1 to the line sensor section 3. The in-focus positions at a previous inspection (detection) position "x" can therefore be calculated accurately.

Any one of the above embodiments of the present invention can be applied to electron beam inspection based on projection electron microscopy.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes that come within the meaning and range of equivalency of the claims are therefore intended to be embraced therein.

What is claimed is:

1. An apparatus for electron beam inspection with projection electron microscopy, comprising:
    an electron irradiation optics which converges and irradiates a planar electron beam obtained by shaping an electron beam emitted from an electron source, via an object lens to a surface of an object to be inspected;
    an electric-field generating unit which generates such an electric field that causes the planar electron beam irradiated from the electron irradiation optics to be drawn backward from neighborhood of the surface of the object to be inspected;
    an electron-imaging optics which images, as an electron beam image, electrons drawn backward from the neighborhood of the surface of the object by the electric field generated by the electric-field generating unit;
    an image detection unit which detects an inspection image signal by converting a focusing inspection image of the object into the inspection image signal, wherein the focusing inspection image is imaged by the electron-imaging optics;
    a focus position controller which controls a focus position of the objective lens so that the focusing inspection image of the object can be detected by the image detection unit; and
    a defect judgment unit which detects a defect formed on the object, by judgment processing the inspection image signal detected by the image detection unit;
    wherein the focus position controller further includes:
    a focus measure calculation unit which calculates focus measure from a plurality of image signals into which electron beam images imaged by the electron-imaging optics, at a plurality of focus positions different from one another in focus offsets, are converted by the image detection unit;
    a focus position calculation unit which calculates height of a confocal plane conjugate to a plane of convergence of the planar electron beam by the objective lens in relation to the electron-imaging optics, on the basis of the focus measure calculated by the focus measure calculation unit, and then calculates the focus position of the objective lens to detect the focusing inspection image of the object in the image detection unit, on the basis of the calculated height of the confocal plane; and a focus position correction unit which corrects the focus position of the objective lens according to the focus position thereof calculated by the focus position calculation unit.

2. The electron beam inspection apparatus according to claim 1, wherein the image detection unit is constructed such that a plurality of sensor sections are arranged in a moving direction of the object to be inspected, each of the sensor sections including a photoluminescent plate for converting an electron beam image into photoluminescent light, an optical-fiber bundle for guiding the photoluminescent light, and a TDI sensor for converting the guided photoluminescent light into a signal, and each of the photoluminescent plates being installed with a difference in height.

3. The electron beam inspection apparatus according to claim 2, wherein, in the electron irradiation optics, a slit with an aperture and with an oblique-stripe pattern on one side of both sides of the aperture is disposed in a position where the planar electron beam is to be shaped.

4. The electron beam inspection apparatus according to claim 2, wherein the inspection image detection sensor section includes a photoluminescent plate for converting an electron beam image into photoluminescent light, an optical-fiber bundle for guiding the photoluminescent light, and a TDI sensor for converting the guided photoluminescent light into a signal.

5. The electron beam inspection apparatus according to claim 1, wherein the image detection unit is constructed such that at least three of sensor sections are arranged in a moving direction of the object to be inspected, each of the sensor sections including a photoluminescent plate for converting an electron beam image into photoluminescent light, an optical-fiber bundle for guiding the photoluminescent light, and a TDI sensor for converting the guided photoluminescent light into a signal, and each of the photoluminescent plates being installed with a difference in height.

6. The electron beam inspection apparatus according to claim 5, wherein the image detection unit is constructed so as to detect an image formed by mirror electrons which reflect from an equipotential plane generated near a top layer of the object to be inspected.

7. The electron beam inspection apparatus according to claim 5, wherein the image detection unit is constructed such that a plurality of sensor sections are arranged in the moving direction of the object to be inspected, each of the sensor sections including a photoluminescent plate for converting an electron beam image into photoluminescent light, an optical-fiber bundle for guiding the photoluminescent light, and a TDI sensor for converting the guided photoluminescent light into a signal, and the photoluminescent plates being continuously inclined in such a form that adjacent photoluminescent plates are contiguous to each other.

8. An apparatus for electron beam inspection with projection electron microscopy, comprising:
an electron irradiation optics which converges and irradiates a planar electron beam obtained by shaping an electron beam emitted from an electron source, via an object lens to a surface of an object to be inspected;
an electric-field generating unit which generates such an electric field that causes the planar electron beam irradiated from the electron irradiation optics to be drawn backward from neighborhood of the surface of the object to be inspected;
an electron-imaging optics which images, as an electron beam image, electrons drawn backward from the neighborhood of the surface of the object by the electric field generated by the electric-field generating unit;
an inspection image detection sensor unit which detects an inspection image signal by converting a focusing inspection image of an inspection region of the object into the inspection image signal, wherein the focusing inspection image of the inspection region is imaged by the electron-imaging optics;
a focus position controller which controls a focus position of the objective lens so that the focusing inspection image of the inspection region can be detected by the inspection image detection sensor unit; and
an image processing unit which detects a defect formed on the object, by image processing the inspection image signal detected by the inspection image detection sensor unit;
wherein the focus position controller further includes:
a focus measure calculation unit which has a focus measure sensor section which converts, into image signals, electron beam images imaged by the electron-imaging optics, at a plurality of focus positions different from one another in focus offsets, wherein the focus measure calculation unit then calculates focus measure from the plurality of image signals converted by the focus measure sensor section;
a focus position calculation unit which calculates height of a confocal plane conjugate to a plane of convergence of the planar electron beam by the objective lens in relation to the electron-imaging optics, on the basis of the focus measure calculated by the focus measure calculation unit, and then calculates the focus position of the objective lens to detect the focusing inspection image of the inspection region in the inspection image detection sensor section, on the basis of the calculated height of the confocal plane; and
a focus position correction unit which corrects the focus position of the objective lens according to the focus position thereof calculated by the focus position calculation unit.

9. The electron beam inspection apparatus according to claim 8, wherein the focus measure sensor section is disposed on one side or both sides of the inspection image detection sensor section, in a moving direction of the object.

10. The electron beam inspection apparatus according to claim 8, wherein the focus measure sensor section includes a plurality of sensors being differed in-focus positions to each other.

11. The electron beam inspection apparatus according to claim 8, wherein the focus measure sensor section includes a photoluminescent plate for converting an electron beam image into photoluminescent light, an optical-fiber bundle for guiding the photoluminescent light, and a line sensor for converting the guided photoluminescent light into a signal.

12. The electron beam inspection apparatus according to claim 8, wherein, when the inspection image detection sensor section and the focus measure sensor section detect the images formed by mirror electrons which reflect from an equipotential plane generated near a top layer of the object to be inspected, the inspection image detection sensor section is adjusted to be positioned at a focusing plane of a negatively charged defect or of a positively charged defect according to shifting between a focusing plane of the inspection image detection sensor section and a focusing plane of the focus measure sensor section.

13. A method for electron beam inspection with projection electron microscopy, comprising:
an electron irradiation step for irradiating a planar electron beam converged via an objective lens to a surface of an object to be inspected, by an electron irradiation optics;

an electric-field generating step for generating such an electric field that causes the planar electron beam irradiated in the electron irradiation step to be drawn backward from neighborhood of a surface of the object to be inspected;

an electron-imaging step for imaging as an electron beam image, electrons drawn backward from the neighborhood of the surface of the object by the electric field generated in the electric-field generating step, by an electron-imaging optics;

an image detection step for detecting an inspection image signal by converting a focusing inspection image of the object into the inspection image signal by an image detection unit, wherein the focusing inspection image has been imaged in the electron-imaging step;

a focus position control step for controlling a focus position of the objective lens so that the focusing inspection image of the object can be detected by the image detection unit; and a defect judgment step for detecting a defect formed on the object, by judgment processing the inspection image signal detected in the image detection step;

wherein the focus position control step further includes:

a focus measure calculation step for calculating focus measure from a plurality of image signals into which electron beam images imaged by the electron-imaging optics, at a plurality of focus positions different from one another in focus offsets, are converted;

a focus position calculation step for, on the basis of the focus measure calculated in the focus measure calculation step, calculating height of a confocal plane conjugate to a plane of convergence of the planar electron beam by the objective lens in relation to the electron-imaging optics, and then calculating the focus position of the objective lens to detect the focusing inspection image of the object in the image detection unit, on the basis of the calculated height of the confocal plane; and a focus position correction step for correcting the focus position of the objective lens according to the focus position thereof calculated in the focus position calculation step.

14. The electron beam inspection method according to claim 13, wherein, in the image detection step, the image detection unit is constructed such that a plurality of sensor sections are arranged in a moving direction of the object to be inspected, each of the sensor sections including a photoluminescent plate for converting an electron beam image into photoluminescent light, an optical-fiber bundle for guiding the photoluminescent light, and a TDI sensor for converting the guided photoluminescent light into a signal, and each of the photoluminescent plates being installed with a difference in height, and the image detection unit detecting an image formed by mirror electrons which reflect from an equipotential plane generated near a top layer of the object to be inspected.

15. A method for electron beam inspection with projection electron microscopy, comprising:

an electron irradiation step for irradiating a planar electron beam converged via an objective lens to a surface of an object to be inspected, by an electron irradiation optics;

an electric-field generating step for generating such an electric field that causes the converted planar electron beam irradiated in the electron irradiation step to be drawn backward from neighborhood of a surface of the object to be inspected;

an electron-imaging step for imaging as an electron beam image, electrons drawn backward from the neighborhood of the surface of the object by the electric field generated in the electric-field generating step, by an electron-imaging optics;

an inspection image detection step for detecting an inspection image signal by converting a focusing inspection image of an inspection region of the object into the inspection image signal by an inspection image detection sensor section, wherein the focusing inspection image has been imaged in the electron-imaging step;

a focus position control step for controlling a focus position of the objective lens so that the focusing inspection image of the inspection region can be detected by the inspection image detection sensor section; and an image-processing step for detecting a defect formed on the object, by image processing of the inspection image signal detected in the inspection image detection step;

wherein the focus position control step further includes:

a focus measure calculation step including a focus measure measuring step for receiving electron beam images imaged by the electron-imaging optics at a plurality of focus positions different from one another in focus offsets and converting the received electron beam images into a plurality of image signals in a focus measure sensor section, the focus measure calculation step being executed to calculate focus measure from the plurality of image signals converted by the focus measure sensor section;

a focus position calculation step for, on the basis of the focus measure calculated in the focus measure calculation step, calculating height of a confocal plane conjugate to a plane of convergence of the planar electron beam by the objective lens in relation to the electron-imaging optics, and then calculating the focus position of the objective lens to detect the focusing inspection image of the inspection region in the inspection image detection sensor section, on the basis of the calculated height of the confocal plane; and a focus position correction step for correcting the focus position of the objective lens according to the focus position thereof calculated in the focus position calculation step.

16. The electron beam inspection method according to claim 15, wherein, the focus measure sensor section for receiving the electron beam images in the focus measure measuring step is disposed on one side or both sides of the inspection image detection sensor section for detecting the inspection image signal in the inspection image detection step, in a moving direction of the object.

17. The electron beam inspection method according to claim 15, wherein, in the electron irradiation step, the surface of the object to be inspected is irradiated with an electron beam of an oblique-stripe pattern, and in the focus measure measuring step, the focus measure sensor section receives an electron beam image of the oblique-stripe pattern with which the irradiation has been conducted.

18. The electron beam inspection method according to claim 15, wherein, when the inspection image detection sensor section for detecting the inspection image signal in the inspection image detection step detects the images formed by mirror electrons which reflect from an equipotential plane generated near a top layer of the object to be inspected, the inspection image detection sensor section is adjusted to be positioned at a focusing plane of a negatively charged defect or of a positively charged defect.

* * * * *